(12) United States Patent
Cheng et al.

(10) Patent No.: US 10,861,958 B2
(45) Date of Patent: Dec. 8, 2020

(54) INTEGRATED CIRCUITS WITH GATE STACKS

(71) Applicant: Taiwan Semiconductor Manufacturing Co., Ltd., Hsinchu (TW)

(72) Inventors: Kuan-Lun Cheng, Hsin-Chu (TW); Li-Shyue Lai, Hsinchu County (TW); Ching-Wei Tsai, Hsinchu (TW); Kai-Chieh Yang, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/404,239

(22) Filed: May 6, 2019

(65) Prior Publication Data

US 2019/0259862 A1    Aug. 22, 2019

Related U.S. Application Data

(63) Continuation of application No. 15/812,350, filed on Nov. 14, 2017, now Pat. No. 10,283,623.

(Continued)

(51) Int. Cl.
| | |
|---|---|
| *H01L 29/66* | (2006.01) |
| *H01L 21/28* | (2006.01) |
| *H01L 29/40* | (2006.01) |
| *H01L 29/51* | (2006.01) |
| *H01L 29/423* | (2006.01) |

(Continued)

(52) U.S. Cl.
CPC .. *H01L 29/66795* (2013.01); *H01L 21/28158* (2013.01); *H01L 21/31144* (2013.01); *H01L 29/401* (2013.01); *H01L 29/42364* (2013.01); *H01L 29/42368* (2013.01); *H01L 29/513* (2013.01); *H01L 29/517* (2013.01);

(Continued)

(58) Field of Classification Search
None
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |

(Continued)

FOREIGN PATENT DOCUMENTS

| | | |
|---|---|---|
| KR | 20150086165 | 7/2015 |
| KR | 20160113807 | 10/2016 |

*Primary Examiner* — Asok K Sarkar
(74) *Attorney, Agent, or Firm* — Haynes and Boone, LLP

(57) ABSTRACT

Examples of an integrated circuit with a gate stack and a method for forming the integrated circuit are provided herein. In some examples, a method includes receiving a workpiece that includes: a pair of sidewall spacers disposed over a channel region, a gate dielectric disposed on the channel region and extending along a vertical surface of a first spacer of the pair of sidewall spacers, and a capping layer disposed on the high-k gate dielectric and extending along the vertical surface. A shaping feature is formed on the capping layer and the high-k gate dielectric. A first portion of the high-k gate dielectric and a first portion of the capping layer disposed between the shaping feature and the first spacer are removed to leave a second portion of the high-k gate dielectric and a second portion of the capping layer extending along the vertical surface.

20 Claims, 15 Drawing Sheets

Related U.S. Application Data

(60) Provisional application No. 62/537,545, filed on Jul. 27, 2017.

(51) Int. Cl.
*H01L 21/311* (2006.01)
*H01L 29/49* (2006.01)

(52) U.S. Cl.
CPC .... *H01L 29/66545* (2013.01); *H01L 29/4966* (2013.01); *H01L 29/518* (2013.01)

(56) References Cited

U.S. PATENT DOCUMENTS

| | | | |
|---|---|---|---|
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,356,027 B1 | 5/2016 | Cheng et al. | |
| 9,437,714 B1 | 9/2016 | Adusumilli et al. | |
| 9,520,482 B1 | 12/2016 | Chang et al. | |
| 9,576,814 B2 | 2/2017 | Wu et al. | |
| 2015/0021704 A1* | 1/2015 | Zang | H01L 21/28088 257/369 |
| 2015/0243564 A1 | 8/2015 | Zhao | |
| 2015/0255458 A1* | 9/2015 | Ando | H01L 29/42376 257/401 |
| 2016/0111512 A1* | 4/2016 | Leobandung | H01L 29/517 257/407 |
| 2016/0163809 A1* | 6/2016 | Ok | H01L 29/49 257/369 |
| 2017/0077256 A1* | 3/2017 | Adusumilli | H01L 29/6656 |
| 2017/0278969 A1* | 9/2017 | Adusumilli | H01L 23/53266 |
| 2018/0069000 A1* | 3/2018 | Bergendahl | H01L 21/823468 |
| 2018/0076040 A1* | 3/2018 | Ando | H01L 29/66795 |
| 2018/0151678 A1* | 5/2018 | Li | H01L 21/823475 |
| 2018/0197786 A1* | 7/2018 | Li | H01L 29/42376 |
| 2018/0331103 A1* | 11/2018 | Chung | H01L 21/823821 |
| 2019/0035917 A1 | 1/2019 | Cheng et al. | |
| 2019/0096679 A1* | 3/2019 | Kannan | H01L 21/28088 |

* cited by examiner

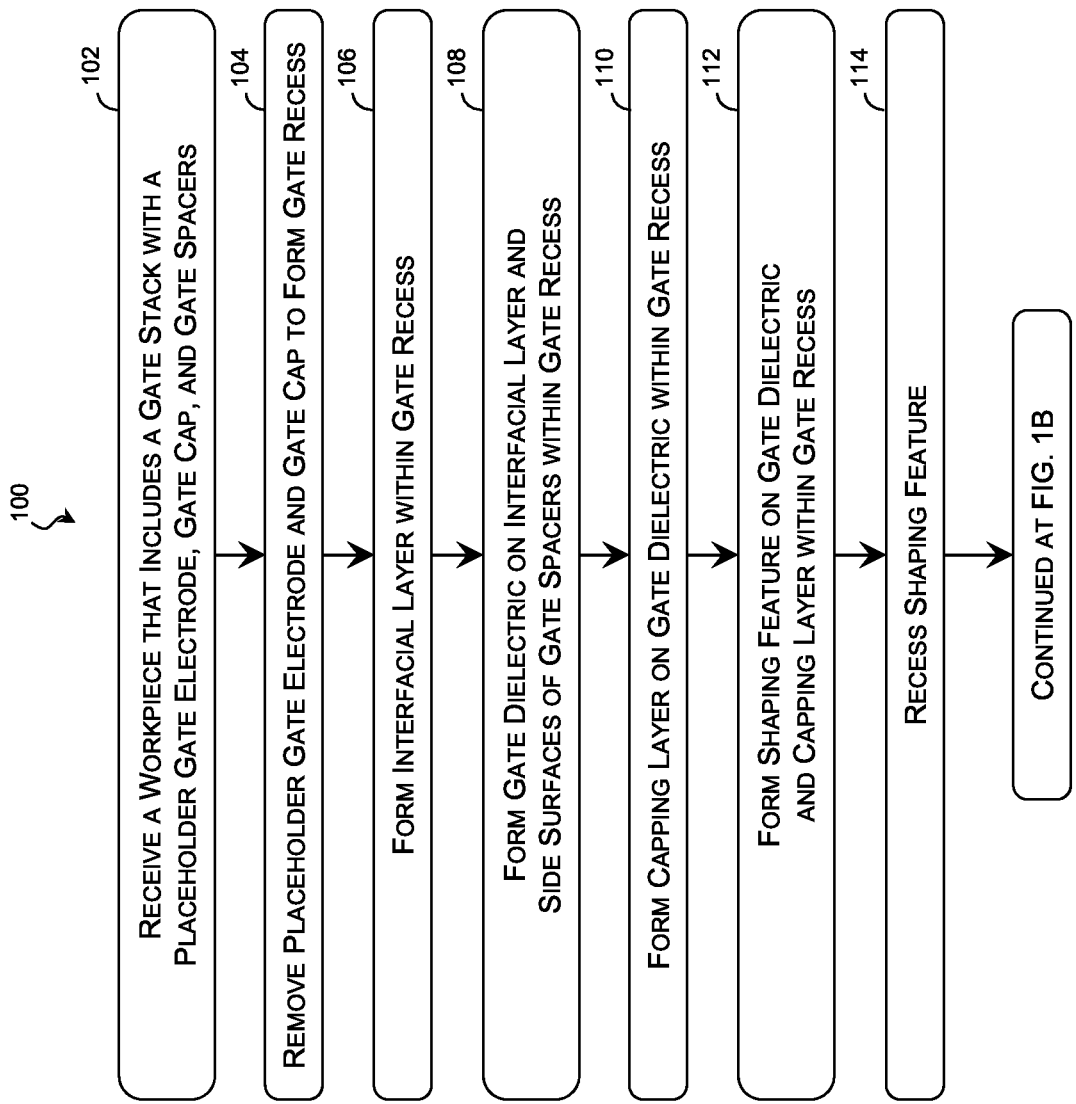

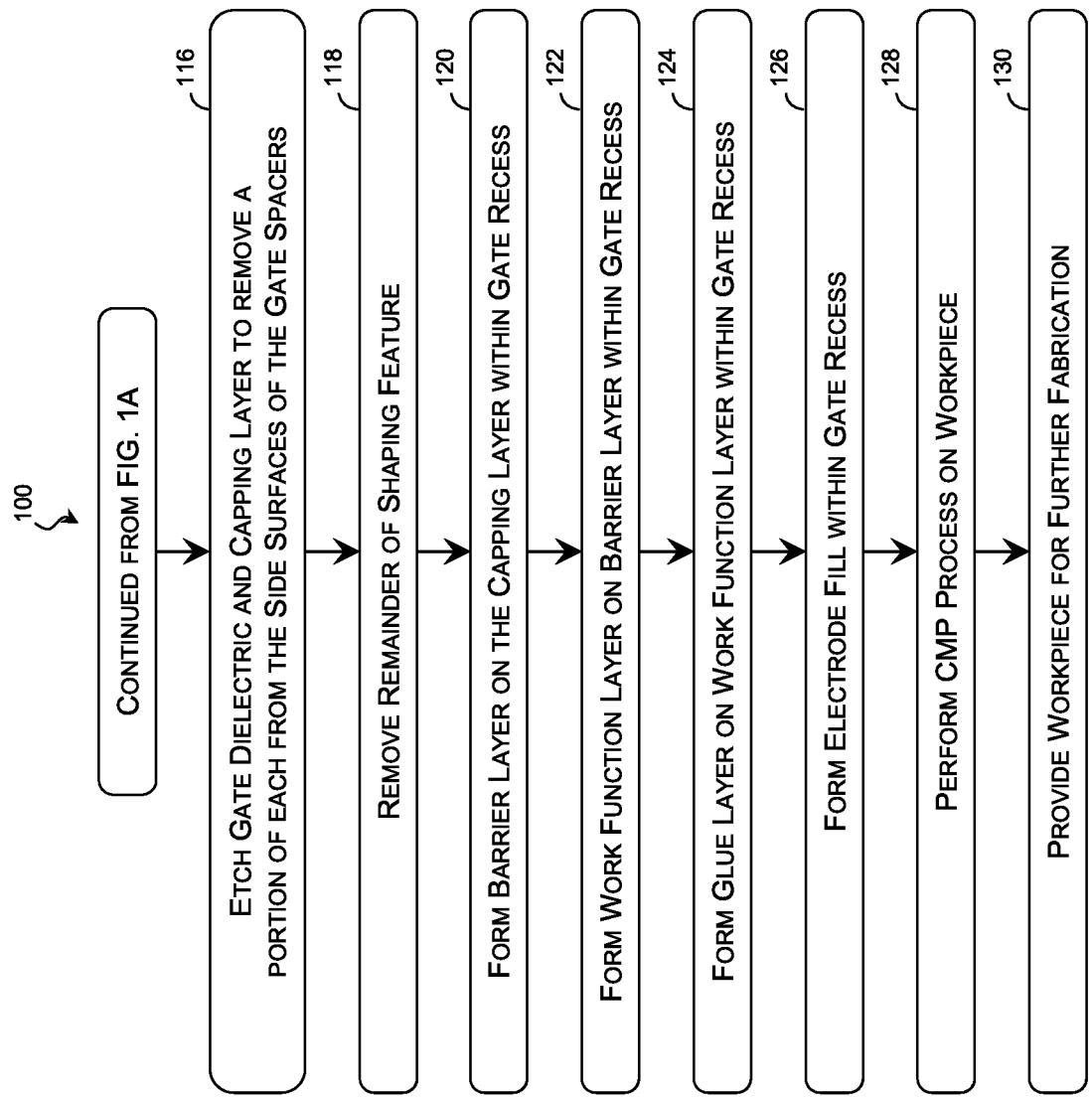

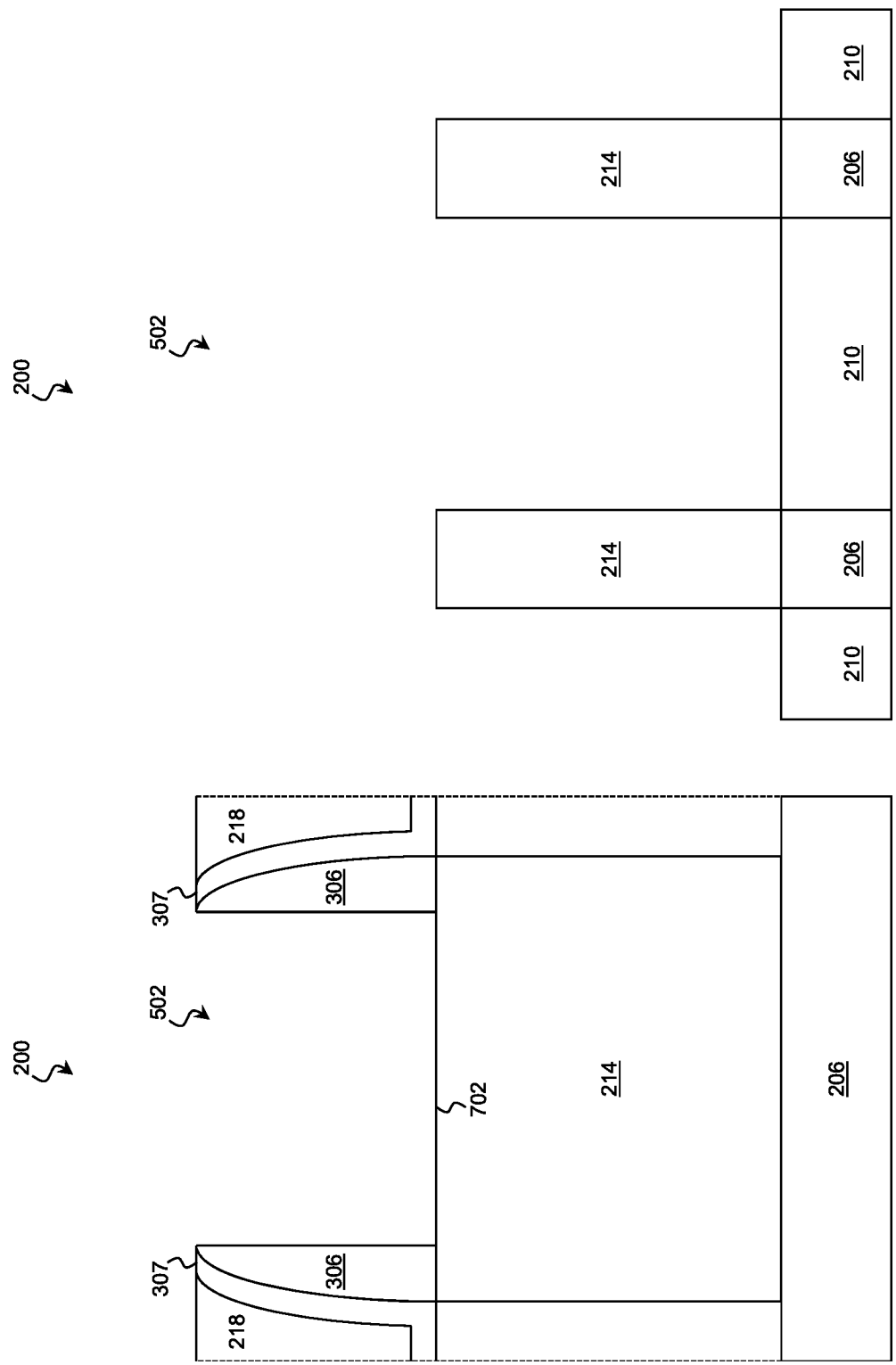

INTEGRATED CIRCUITS WITH GATE STACKS

PRIORITY DATA

The present application is a continuation application of U.S. patent application Ser. No. 15/812,350, filed Nov. 14, 2017, which claims the benefit of U.S. Provisional Application No. 62/537,545, entitled "Integrated Circuits with Gate Stacks," filed Jul. 27, 2017, each of which is herein incorporated by reference in its entirety.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs. Parallel advances in manufacturing have allowed increasingly complex designs to be fabricated with precision and reliability.

For example, the materials used to form a gate stack of a transistor have continued to evolve. At a high level, a gate stack may include a conductor and a gate dielectric that separates the conductor from a channel region of the transistor. Initially, polysilicon replaced aluminum as the conductor in the gate stack. However, polysilicon has a higher impedance than many metals, and to improve performance, advanced fabrication processes have moved back to metal gates at the cost of increased complexity.

Another set of advances enabled the fabrication of three-dimensional designs, such as a fin-like field effect transistor (FinFET). A FinFET may be envisioned as a typical planar device extruded out of a substrate and into the gate. An exemplary FinFET is fabricated with a thin "fin" (or fin structure) extending up from a substrate. The channel region of the FET is formed in this vertical fin, and a gate is provided over (e.g., wrapping around) the channel region of the fin. Wrapping the gate around the fin increases the contact area between the channel region and the gate and allows the gate to control the channel from multiple sides. This can be leveraged in a number of way, and in some applications, FinFETs provide reduced short channel effects, reduced leakage, and higher current flow. In other words, they may be faster, smaller, and more efficient than planar devices.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A and 1B are flow diagrams of a method of fabricating a workpiece with a replacement gate according to various aspects of the present disclosure.

FIGS. 3, 5, 7, 9, 11, 13, 15, 17, and 19 are cross-sectional views of a workpiece taken along a first cross-sectional plane at various points in a method of fabrication according to various aspects of the present disclosure.

FIGS. 4, 6, 8, 10, 12, 14, 16, 18, and 20 are cross-sectional views of a workpiece taken along a second cross-sectional plane at various points in a method of fabrication according to various aspects of the present disclosure.

DETAILED DESCRIPTION

Figure 2:
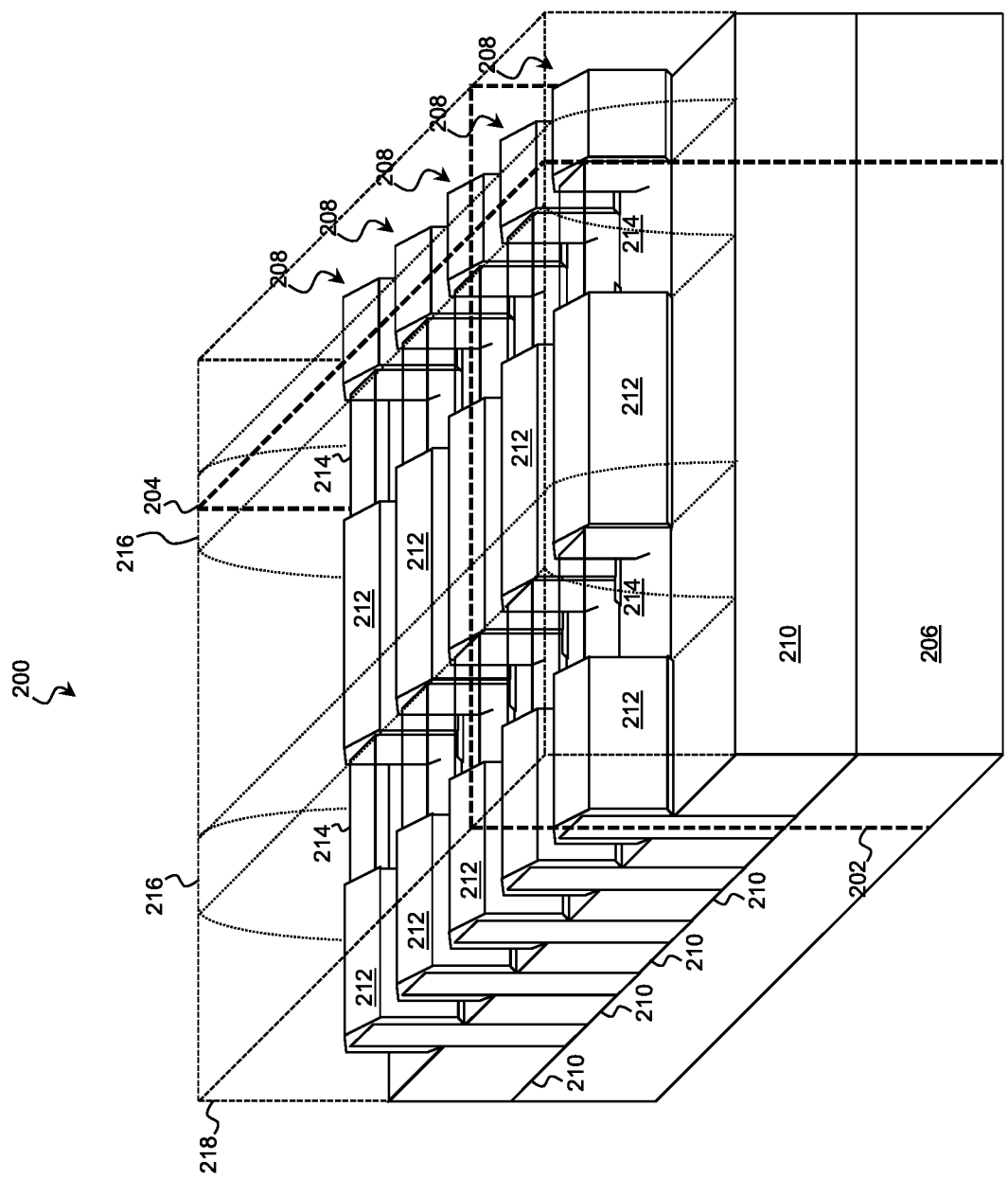
FIG. 2 is a perspective view diagram of a workpiece undergoing a method of fabrication according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations beyond the extent noted.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature.

The spatially relative terms are intended to cover different orientations of the device including the features.

At its most basic, a transistor may include a semiconductor doped to form source/drain features separated by a channel region. A gate stack is disposed on the channel region and includes a gate electrode and a gate dielectric separating the gate electrode and the channel region. While any suitable gate dielectric may be used, many examples of the present disclosure use a high-k dielectric to reduce leakage current, reduce threshold voltage, and/or optimize the operation of the transistor.

In some examples, a placeholder (e.g., polysilicon) gate is used during a substantial amount of the fabrication process. The placeholder gate is subsequently replaced with functional gate components. However, forming the functional components within the recess left by the placeholder gate has proven challenging. It has been determined that, for example, forming the gate dielectric conformally along the entire sidewalls of the recess may increase parasitic capacitance, reduce the strength of the inversion charge, and increase the risk of voids and other imperfections when depositing the gate material. As described below, in some examples, some or all of the gate dielectric is removed from the sidewalls of the recess. These examples may thereby provide improved device performance and reliability. However, unless otherwise noted, no embodiment is required to provide any particular advantage.

The techniques of the present disclosure may be used to form a variety of planar and non-planar devices. Examples of a FinFET and a method of forming such are described with reference to FIGS. 1A-20. In that regard, FIGS. 1A and 1B are flow diagrams of a method 100 of fabricating a workpiece 200 with a replacement gate according to various aspects of the present disclosure. Additional steps can be provided before, during, and after the method 100, and some of the steps described can be replaced or eliminated for other embodiments of the method 100. FIG. 2 is a perspective view diagram of the workpiece 200 undergoing the method 100 of fabrication according to various aspects of the present disclosure. FIGS. 3, 5, 7, 9, 11, 13, 15, 17, and 19 are cross-sectional views of the workpiece 200 taken along a first cross-sectional plane (plane 202 of FIG. 2) at various points in the method 100 according to various aspects of the present disclosure. FIGS. 4, 6, 8, 10, 12, 14, 16, 18, and 20 are cross-sectional views of the workpiece 200 taken along a second cross-sectional plane (plane 204 of FIG. 2) at various points in the method 100 according to various aspects of the present disclosure. FIGS. 2-20 have been simplified for the sake of clarity and to better illustrate the concepts of the present disclosure. Additional features may be incorporated into the workpiece 200, and some of the features described below may be replaced or eliminated for other embodiments of the workpiece 200.

Referring to block 102 of FIG. 1A and to FIG. 2, the workpiece 200 is received. The workpiece 200 includes a substrate 206 upon which devices are to be formed. In various examples, the substrate 206 includes an elementary (single element) semiconductor, such as silicon or germanium in a crystalline structure; a compound semiconductor, such as silicon germanium, silicon carbide, gallium arsenic, gallium phosphide, indium phosphide, indium arsenide, and/or indium antimonide; a non-semiconductor material, such as soda-lime glass, fused silica, fused quartz, and/or calcium fluoride ($CaF_2$); and/or combinations thereof.

The substrate 206 may be uniform in composition or may include various layers, some of which may be selectively etched to form the fins. The layers may have similar or different compositions, and in various embodiments, some substrate layers have non-uniform compositions to induce device strain and thereby tune device performance. Examples of layered substrates include silicon-on-insulator (SOI) substrates 206. In some such examples, a layer of the substrate 206 may include an insulator such as a semiconductor oxide, a semiconductor nitride, a semiconductor oxynitride, a semiconductor carbide, and/or other suitable insulator materials.

In some examples, the devices to be formed on the substrate 206 extend out of the substrate 206. For example, FinFETs and/or other non-planar devices may be formed on device fins 208 disposed on the substrate 206. The device fins 208 are representative of any raised feature and include FinFET device fins 208 as well as fins 208 for forming other raised active and passive devices upon the substrate 206. The fins 208 may be formed by etching portions of the substrate 206, by depositing various layers on the substrate 206 and etching the layers, and/or by other suitable techniques. The fins 208 may be similar in composition to the substrate 206 or may be different therefrom. For example, in some embodiments, the substrate 206 may include primarily silicon, while the fins 208 include one or more layers that are primarily germanium or a SiGe compound semiconductor. In some embodiments, the substrate 206 includes a SiGe compound semiconductor, and the fins 208 include one or more layers that include a SiGe compound semiconductor with a different ratio of silicon to germanium.

The fins 208 may be physically and electrically separated from each other by isolation features 210, such as a shallow trench isolation features (STIs). In various examples, the isolation features 210 include dielectric materials such as semiconductor oxides, semiconductor nitrides, semiconductor carbides, FluoroSilicate Glass (FSG), low-K dielectric materials, and/or other suitable dielectric materials.

In some embodiments, a device fin 208 includes a transistor (e.g., FinFET) formed on the fin 208 and defined by a pair of opposing source/drain features 212 separated by a channel region 214. The source/drain features 212 may include a semiconductor (e.g., Si, Ge, SiGe, etc.) and one or more dopants, such as p-type dopants (e.g., boron or $BF_2$) or n-type dopants (e.g., phosphorus or arsenic). Similarly, the channel region 214 may include a semiconductor and one or more dopants of the opposite type of those of the source/drain features 212.

The flow of carriers (electrons for an n-channel FinFET and holes for a p-channel FinFET) through the channel region 214 is controlled by a voltage applied to a gate stack 216 that is adjacent to and overwrapping the channel region 214. The gate stack 216 is shown as translucent to better illustrate the underlying channel region 214 and is shown in more detail in subsequent figures.

The workpiece 200 includes an Inter-Level Dielectric (ILD) layer 218 disposed on the workpiece 200. The ILD layer 218 is shown as translucent to better illustrate the remainder of the workpiece 200. The ILD layer 218 acts as an insulator that supports and isolates conductive traces of an electrical multi-level interconnect structure that electrically interconnects elements of the workpiece 200, such as the source/drain features 212 and the gate stack 216. The ILD layer 218 may comprise a dielectric material (e.g., a semiconductor oxide, a semiconductor nitride, a semiconductor oxynitride, a semiconductor carbide, etc.), Spin On Glass (SOG), FSG, phosphosilicate glass (PSG), borophosphosilicate glass (BPSG), Black Diamond® (Applied Materials of Santa Clara, Calif.), Xerogel, Aerogel, amorphous fluorinated carbon, parylene, BCB, SILK® (Dow Chemical of Midland, Mich.), and/or combinations thereof. The ILD layer 218 may be formed by any suitable process including Chemical Vapor Deposition (CVD), Physical Vapor Deposition (PVD), spin-on deposition, and/or other suitable processes.

Figure 4:
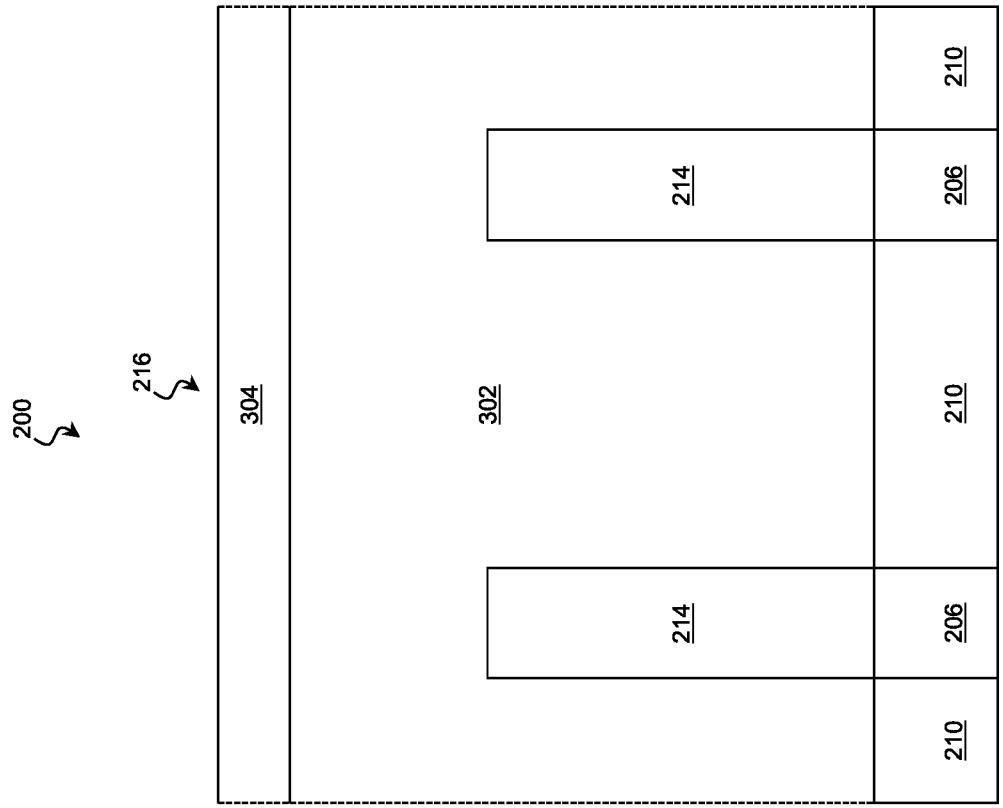
Figure 3:
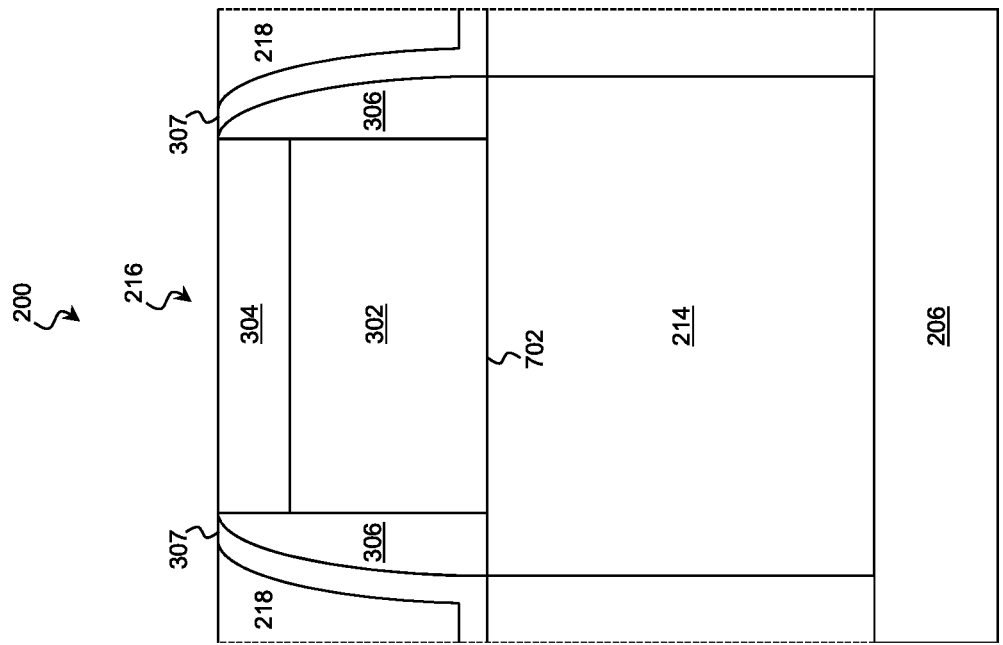

Referring to FIGS. 3 and 4, when the workpiece 200 is received, the gate stack 216 may include placeholder elements such as a placeholder gate electrode 302. For example in a gate-last process, the placeholder gate electrode 302 is used during some of the fabrication processes and subsequently removed and replaced with one or more functional gate features (e.g., gate electrode material, gate dielectric layer material, interfacial layer, etc.). This may be done when the functional features are sensitive to some fabrication processes, such as source/drain activation annealing. The placeholder gate electrode 302 may include polysilicon, dielectric material, and/or other suitable materials.

The gate stack 216 may also include a gate cap 304 disposed on a top surface of the placeholder gate electrode 302. The gate cap 304 protects the placeholder gate electrode 302 during fabrication processes such as etching. In various examples, the gate cap 304 includes a dielectric material (e.g., semiconductor oxides, semiconductor nitrides, semiconductor oxynitrides, semiconductor carbides, semiconductor oxycarbonitrides, etc.), and/or other suitable materials. In one embodiment, the gate cap 304 includes silicon carbide.

The gate stack 216 may also include gate spacers 306 or sidewall spacers disposed on the side surfaces of the placeholder gate electrode 302. Similar to the gate cap 304, the gate spacers 306 may protect the placeholder gate electrode 302 and may be used when forming the source/drain features 212 to control their offset and junction profile. In various examples, the gate spacers 306 include dielectric materials (e.g., semiconductor oxides, semiconductor nitrides, semiconductor oxynitrides, semiconductor carbides, semiconductor oxycarbonitrides, etc.), and/or other suitable materials, and are different in composition and etchant sensitivity from the gate cap 304. In one embodiment, the gate spacers 306 each include one or more layers of silicon nitride and/or silicon oxide.

In some embodiments, the workpiece 200 includes a Contact Etch Stop Layer (CESL) 307 disposed alongside of the gate spacers 306. The CESL 307 may surround and cover the source/drain features 212 and may be disposed on top of those portions of the isolation features 210 that are not covered by the gate stack 216. The CESL 307 may include a dielectric (e.g., a semiconductor oxide, a semiconductor nitride, a semiconductor oxynitride, a semiconductor carbide, etc.) or other suitable material, and in various embodiments, the CESL 307 includes SiN, SiO, and/or SiON. The ILD layer 218 may be disposed on the CESL 307.

Referring to block 104 of FIG. 1A and to FIGS. 5 and 6, an etching process is used to remove the gate cap 304 and the placeholder gate electrode 302. Removing the gate cap 304 and the placeholder gate electrode 302 while leaving the gate spacers 306 and ILD layer 218 defines a gate recess 502 within which to form functional structures of the gate stack 216. The bottom of the gate recess 502 may be defined by the exposed channel region 214 and the isolation features 210, and the sides of the gate recess 502 may be defined by the gate spacers 306. The etching processes may include any suitable etching technique such as wet etching, dry etching, Reactive Ion Etching (RIE), ashing, and/or other etching methods. In some embodiments, the etching process includes dry etching using an oxygen-based etchant, a fluorine-based etchant, a chlorine-based etchant, a bromine-based etchant, an iodine-based etchant, other suitable etchant gases or plasmas, and/or combinations thereof. In some embodiments, the etching process include a first stage using a technique and etchant selected to selectively etch the gate cap 304 without significant etching of the surrounding structures and a second stage using a technique and etchant selected to selectively etch the placeholder gate electrode 302 without significant etching of the surrounding structures.

Figure 8:
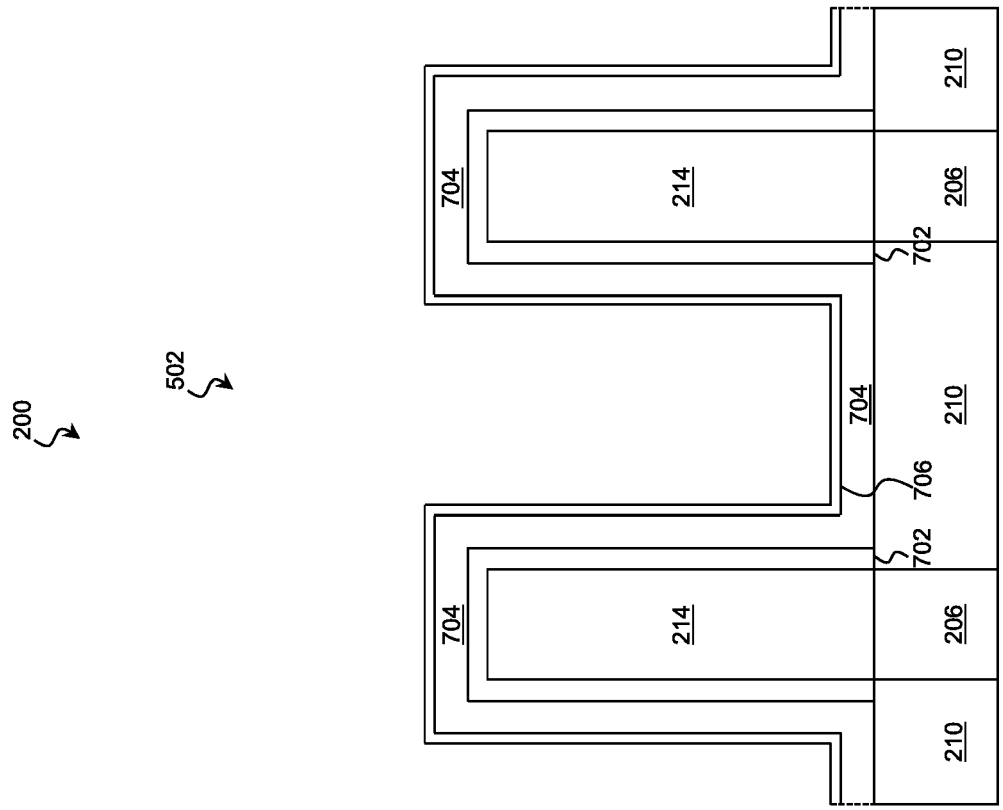
Figure 7:
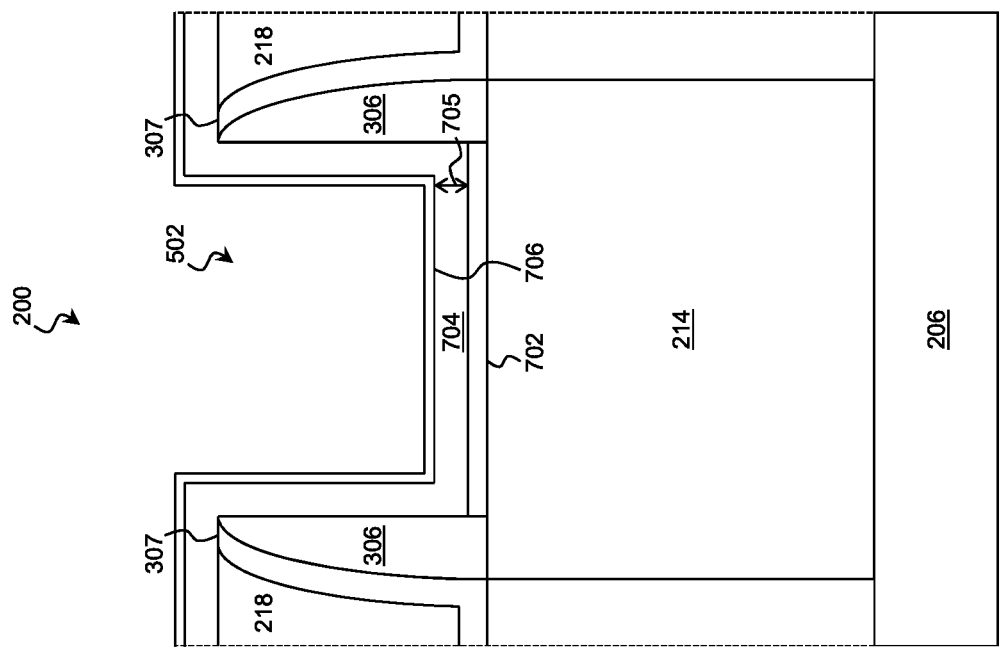

Referring to block 106 of FIG. 1A and to FIGS. 7 and 8, an interfacial layer 702 is formed on the top and side surfaces of the fin 208 within the gate recess 502. The interfacial layer 702 may include any suitable material, such as a dielectric (e.g., a semiconductor oxide, a semiconductor nitride, a semiconductor oxynitride, a semiconductor carbide, a semiconductor carboxynitride, etc.) or other suitable material. The interfacial layer 702 may be formed by chemical oxidation, thermal oxidation, CVD, Atomic Layer Deposition (ALD), and/or other suitable techniques. Accordingly, in some embodiments, the interfacial layer 702 includes silicon oxide and/or silicon-germanium oxide formed by thermal oxidation.

Referring to block 108 of FIG. 1A and referring still to FIGS. 7 and 8, a gate dielectric layer 704 is formed on the interfacial layer 702 and on the isolation feature 210 within the gate recess 502. When the gate dielectric layer 704 is formed, it may cover the interfacial layer 702 and the isolation feature 210 within the recess 502. It may also extend vertically along the gate spacers 306 along the entire vertical side surfaces of the spacers 306. As explained in more detail below, the vertical portions of the gate dielectric layer 704 may be subsequently removed to reduce coupling capacitance between the gate stack 216 and adjacent features.

Suitable materials for the gate dielectric layer 704 are commonly characterized by their dielectric constant (k) relative to silicon oxide. The gate dielectric layer 704 may include a high-k dielectric material such as $HfO_2$, HfSiO, HfSiON, HfTaO, HfTiO, HfZrO, zirconium oxide ($ZrO_2$), lanthanum oxide ($La_2O_3$), titanium oxide ($TiO_2$), yttrium oxide ($Y_2O_3$), strontium titanate ($SrTiO_3$), aluminum oxide, hafnium dioxide-alumina ($HfO_2$—$Al_2O_3$) alloy, other suitable high-k dielectric materials, and/or combinations thereof. In many applications, high-k dielectric materials reduce tunneling between the gate electrode and the channel region 214, which may reduce leakage, avoid dielectric breakdown, and increase transistor longevity. In some applications, because a high-k dielectric material may allow the gate dielectric layer 704 to be thicker overall, it becomes easier to tune parameters of individual transistors such as operating or threshold voltages by adjusting the thickness of the gate dielectric layer 704.

However, the gate dielectric layer 704 is not limited to high-k dielectric materials. Additionally or in the alternative, the gate dielectric layer 704 may include other dielectrics such as silicon dioxide, silicon nitride, silicon oxynitride, silicon carbide, amorphous carbon, tetraethylorthosilicate (TEOS), other suitable dielectric material, and/or combinations thereof.

The gate dielectric layer 704 may be formed by any suitable technique, such as CVD, ALD, Plasma Enhanced CVD (PE CVD), or Plasma Enhanced ALD (PEALD). The gate dielectric layer 704 may be formed to any suitable thickness 705, and in some examples, the gate dielectric layer 704 has a thickness 705 of between about 0.1 nm and about 3 nm.

Referring to block 110 of FIG. 1A and referring still to FIGS. 7 and 8, a capping layer 706 is formed on the gate dielectric layer 704 within the gate recess 502. The capping layer 706 may cover the horizontal surfaces of the gate dielectric layer 704 as well as the vertical surfaces of the gate dielectric layer 704 that extend vertically along the gate spacers 306. The vertical portions of the capping layer 706 may be subsequently removed along with the vertical portions of the gate dielectric layer 704.

The capping layer 706 may include any suitable conductive material including metals (e.g., W, Al, Ta, Ti, Ni, Cu, Co, etc.), metal nitrides, and/or metal silicon nitrides, and may be deposited via CVD, ALD, PE CVD, PEALD, PVD, and/or other suitable deposition process. In various embodiments, the capping layer 706 includes TaSiN, TaN, or TiN.

Figure 10:
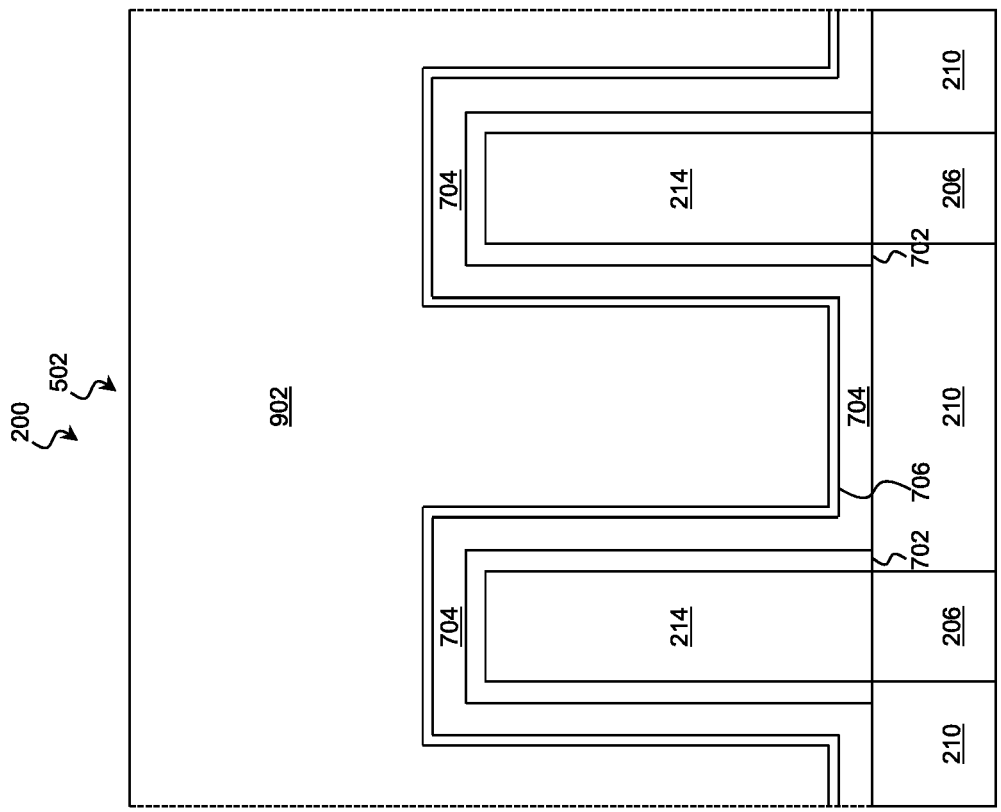
Figure 9:
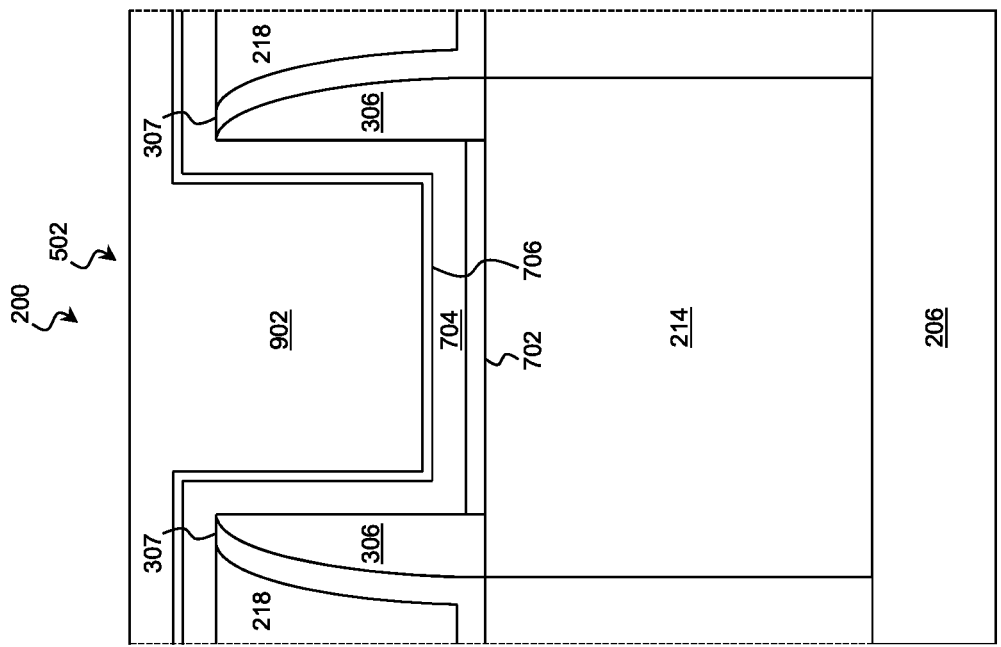

Referring to block 112 of FIG. 1A and to FIGS. 9 and 10, a profile-shaping feature 902 is formed on the workpiece. Specifically, the profile-shaping feature 902 fills the gate recess 502 and protects underlying portions of the gate dielectric layer 704 and the capping layer 706 within the recess 502 during a subsequent etching process. The profile-shaping feature 902 may be formed of any suitable material, which may be selected to have a different etchant sensitivity than the gate dielectric layer 704 and the capping layer 706. In various examples, the profile-shaping feature 902 includes a dielectric (e.g., a semiconductor oxide, a semiconductor nitride, a semiconductor oxynitride, a semiconductor carbide, a semiconductor carboxynitride, etc.), polysilicon, SOG, TEOS, Plasma Enhanced CVD oxide (PE-oxide), High-Aspect-Ratio-Process (HARP)-formed oxide, Bottom Anti-Reflective Coating (BARC), and/or other suitable materials. The profile-shaping feature 902 may be deposited using any suitable process including ALD, CVD, HDP-CVD, PVD, spin-on deposition, and/or other suitable deposition processes.

Figure 11:
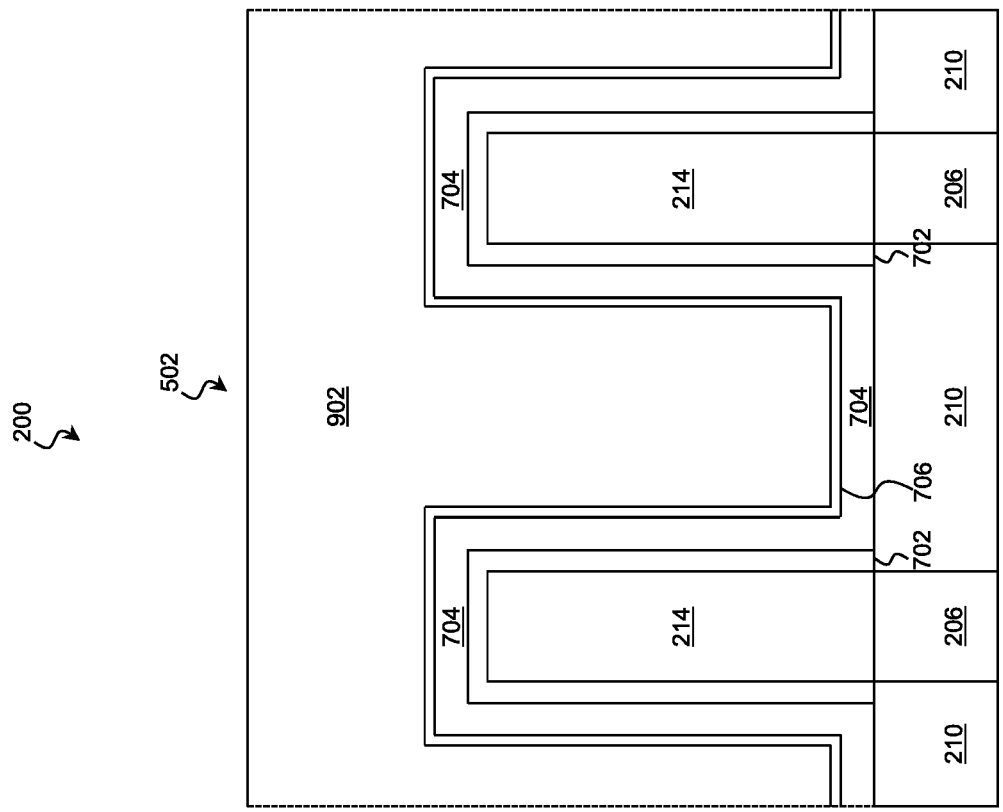
Figure 12:
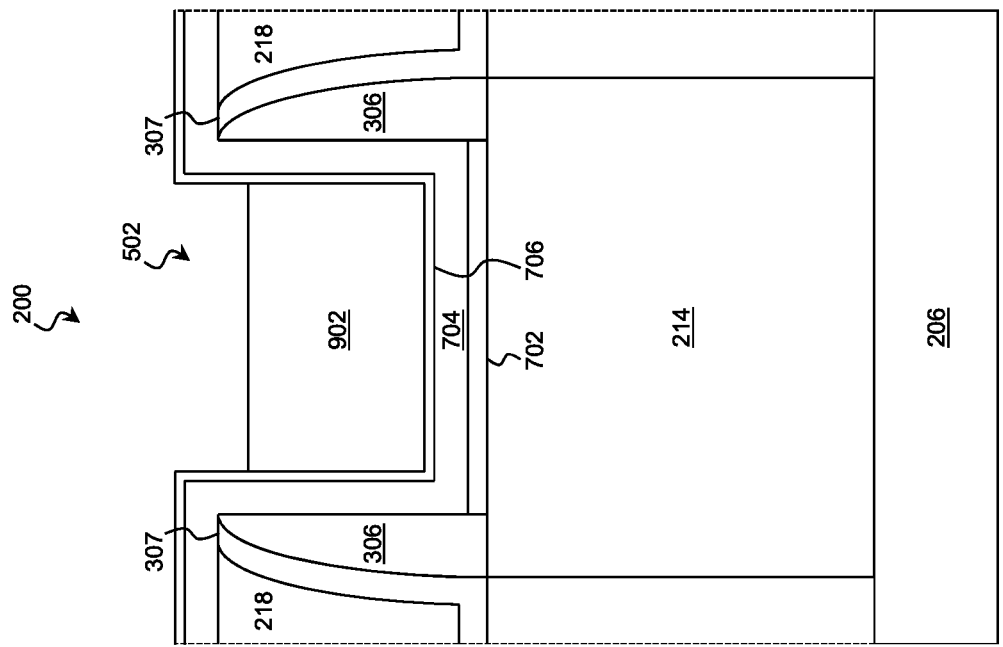

Referring to block 114 of FIG. 1A and to FIGS. 11 and 12, the profile-shaping feature 902 is etched back to expose the gate dielectric layer 704 and the capping layer 706 within the recess 502. In various examples, the profile-shaping feature 902 is etched back using wet etching, dry etching, RIE, and/or Chemical Mechanical Planarization/Polishing (CMP). In some examples, the etching of block 114 is configured to leave a portion of the profile-shaping feature 902 within the gate recess 502 in order to protect underlying portions of the gate dielectric layer 704 and the capping layer 706. The remaining portion of the profile-shaping feature 902 may have any suitable height and/or aspect ratio. In various examples, the profile-shaping feature 902 has an aspect ratio (height to width along the gate length direction) between about 1:1 and about 2:1.

In some examples, the topmost surface of the profile-shaping feature 902 is substantially coplanar with the topmost surface of the gate spacers 306 that define the gate recess 502. In contrast, in some examples, the etching continues until the topmost surface of the profile-shaping feature 902 is below the topmost surface of the gate spacers 306.

Figure 13:
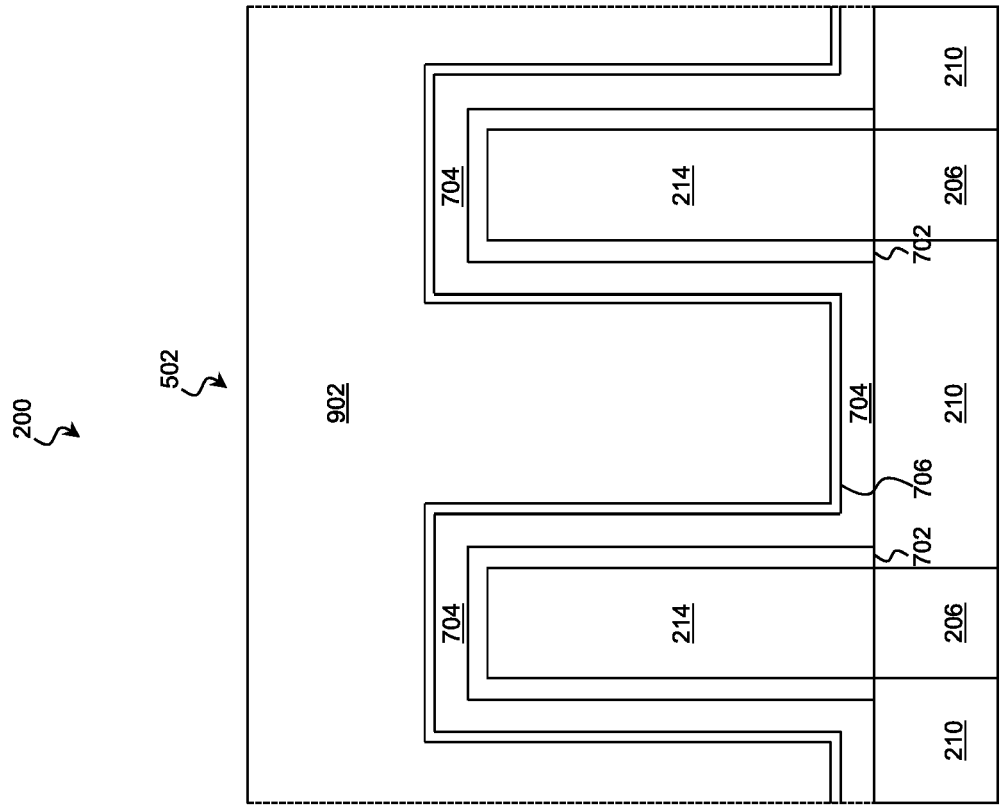
Figure 14:
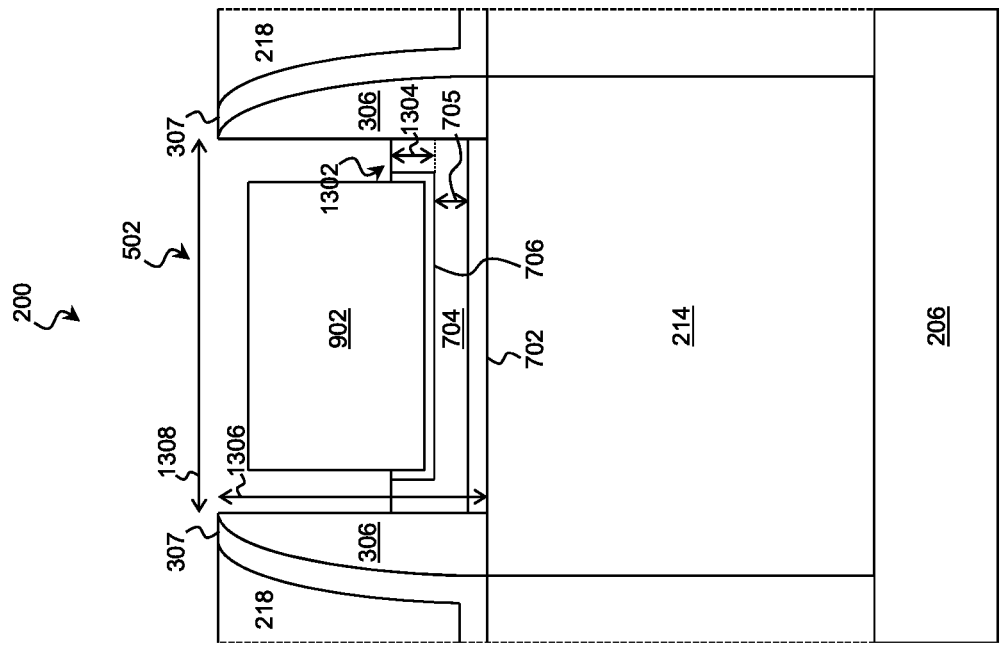

Referring to block 116 of FIG. 1B and to FIGS. 13 and 14, the capping layer 706 and the gate dielectric layer 704 are etched back. Within the recess 502, the etching removes at least some of the capping layer 706 and the gate dielectric layer 704 that extend along the vertical surface of the gate spacers 306. In particular, the etching of block 116 may be configured to stop while the topmost surfaces of the capping layer 706 and gate dielectric layer 704 adjacent the gate spacers 306 are still above the topmost surfaces of the capping layer 706 and the gate dielectric layer 704 underneath the profile-shaping feature 902 and in the center of the recess 502. The remaining region 1302 of the capping layer 706 and gate dielectric layer 704 extending along the vertical surfaces of the gate spacers 306 may have any suitable height 1304 as measured from the top surface of the gate dielectric layer 704 underneath the profile-shaping feature 902.

In various examples, height 1304 is between about 1 nm and about 25 nm, and further examples where the height 1304 is about 0 are shown in subsequent figures below. Thus, in various examples, the ratio of the height 1304 to the thickness 705 of the gate dielectric layer 704 may be between about 1:1 and about 10:1. Put another way, in various examples, the total gate height 1306 is between about 10 nm and about 200 nm, and the ratio of the height 1304 of the region 1302 extending along the vertical surfaces of the gate spacers 306 to the total gate height 1306 is about 1:4 or less. Accordingly, the majority of the vertical surfaces of the gate spacers 306 may be free of the gate dielectric layer 704. For comparison, in some examples, the gate length 1308 is between about 10 nm and about 100 nm, and the ratio of the height 1304 of the region 1302 to the gate length 1308 is about 1:4 or less. While FIG. 13 illustrates examples where the remaining regions of the capping layer 706 and the gate dielectric layer 704 have the same height 1304, further examples are shown below where the capping layer 706 and gate dielectric layer 704 are etched to different depths.

Removing the gate dielectric layer 704 and the capping layer 706 from at least a portion of the gate spacers 306 may provide a number of benefits. For example, removing some of the gate dielectric layer 704 and the capping layer 706 may reduce parasitic capacitances. In some examples, capacitive coupling between the gate stack 216 and a neighboring conductor such as a source/drain contact is reduced. In some examples, fringing capacitance of the gate stack 216 is reduced. These capacitive effects may delay the rise and fall of voltage at the gate and at the source/drain contact. Accordingly, by reducing capacitive coupling, the present structure may provide increased switching speed, decreased switching power consumption, and decreased coupling noise.

In some applications, the width of the gate recess 502 (in the gate length direction 1308) provides a challenge when forming subsequent gate metals in the recess. Removing some of the gate dielectric layer 704 and capping layer 706 provides a wider recess 502 for these gate metals which may improve their uniformity by providing a wider gap to fill. Furthermore, because the gate dielectric layer 704 and the capping layer 706 are removed from at least a portion of the gate spacers 306, the gate metals may be formed closer to the gate spacers 306. In some such examples, this configuration improves the strength and uniformity of the inversion charge created by the gate stack particularly at the boundary of the channel region 214.

In various examples, the etching of the capping layer 706 and gate dielectric layer 704 includes wet etching, dry etching, RIE, and/or other suitable etching processes. In some examples, the etching process and chemicals are selected to avoid significant etching of the gate spacers 306 and the profile-shaping feature 902. The etching of block 116 may include different etching processes and chemicals to target the capping layer 706 and the gate dielectric layer 704 individually. In an example, the etching includes a dry etching process using a chlorine based etchant.

Figure 16:
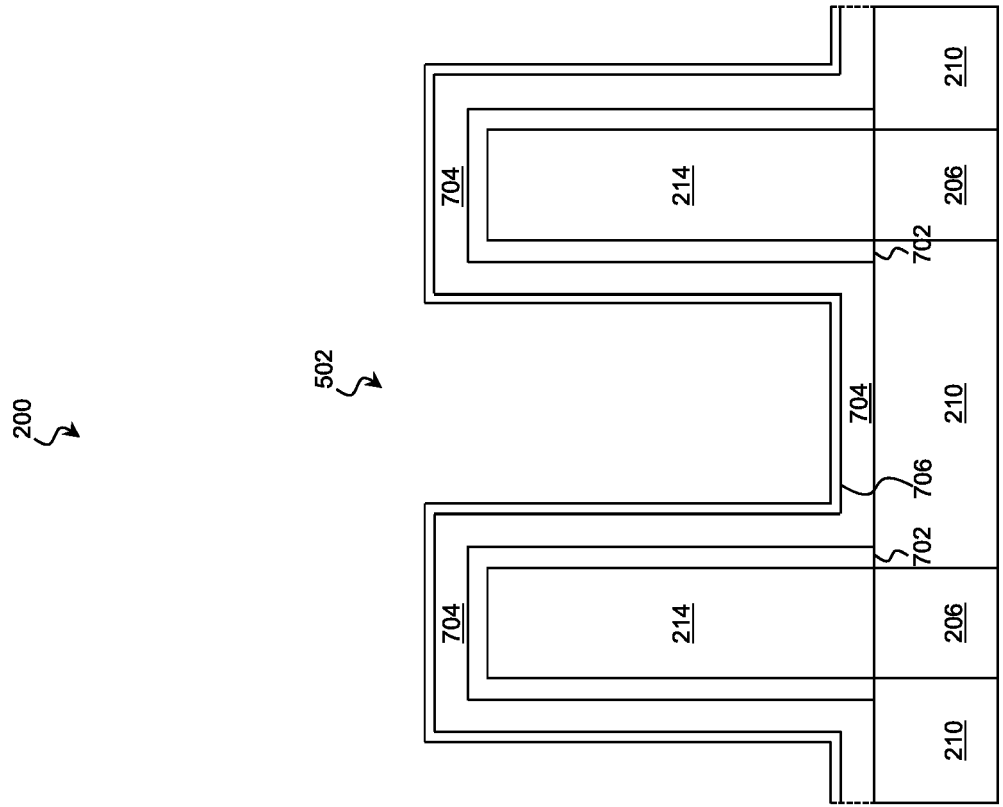
Figure 15:
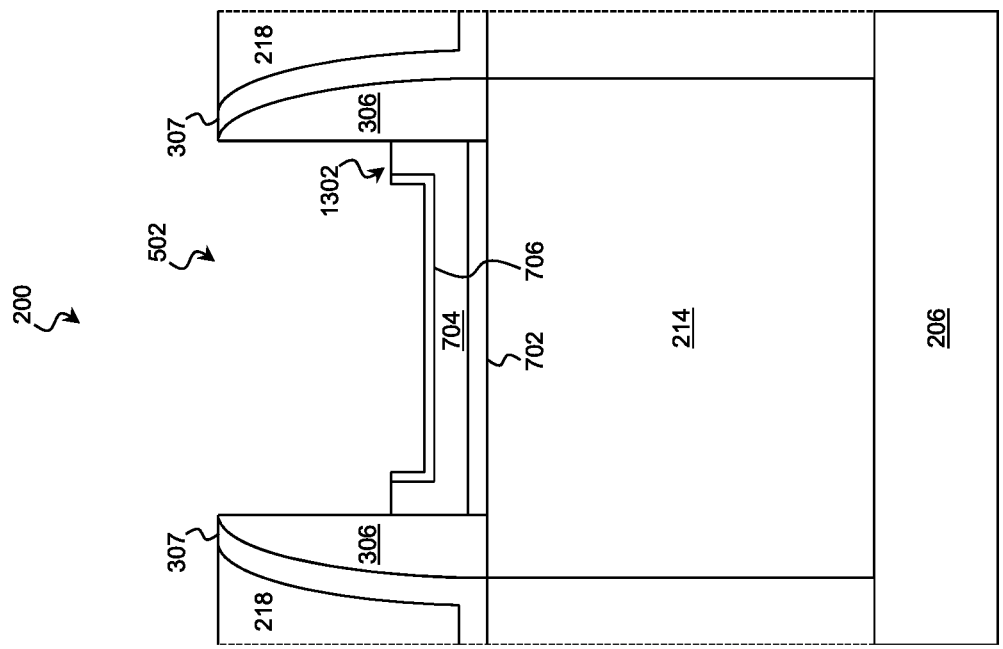

Referring to block 118 of FIG. 1B and to FIGS. 15 and 16, the remainder of the profile-shaping feature 902 is removed from the gate recess 502. The profile-shaping feature 902 may be removed using any suitable etching process such as wet etching, dry etching, RIE, and/or other suitable etching processes, and the particular etching process may be selected to avoid significant etching of the capping layer 706, gate dielectric layer 704, gate spacers 306, and/or other components of the workpiece 200. In some such examples, the profile-shaping feature 902 is removed by ashing with an oxygen reactant.

In the steps that follow, the gate electrode is formed on the shaped capping layer 706 and gate dielectric layer 704. Referring to block 120 of FIG. 1B and to FIGS. 17 and 18, a barrier layer 1702 is formed on the capping layer 706 and on the gate dielectric layer 704 within the gate recess 502. At the sides of the recess 502, the barrier layer 1702 may physically contact the gate dielectric layer 704. The barrier layer 1702 may also physically contact and extend along the vertical surfaces of the gate spacers 306. The barrier layer 1702 may contain any suitable material, such as W, Ti, TiN, Ru, or combinations thereof. Materials for the barrier layer 1702 may be selected based on their resilience to diffusion into the capping layer 706, gate dielectric layer 704, and the gate spacers 306. The barrier layer 1702 may be deposited by any suitable technique including ALD, CVD, PE CVD, PEALD, PVD (e.g., sputtering), and/or combinations thereof. As noted above, because vertical portions of the gate dielectric layer 704 and capping layer 706 have been removed, much of the gate recess 502 is wider, which may provide more uniform deposition of the barrier layer 1702 and subsequent layers.

Figure 18:
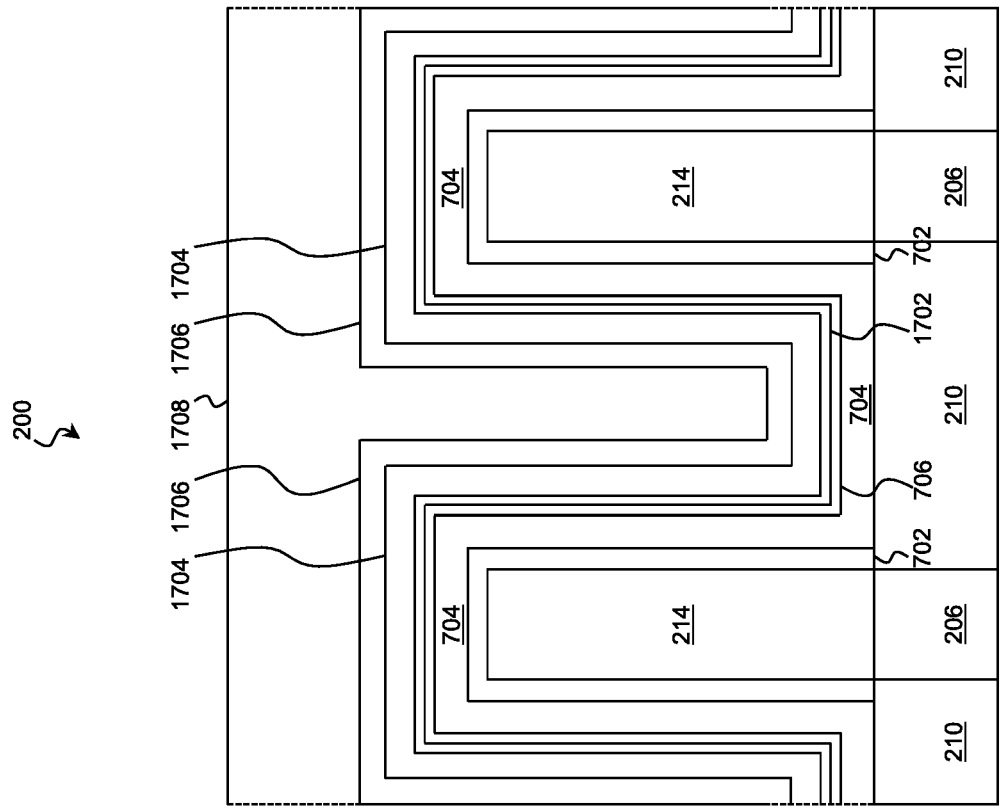
Figure 17:
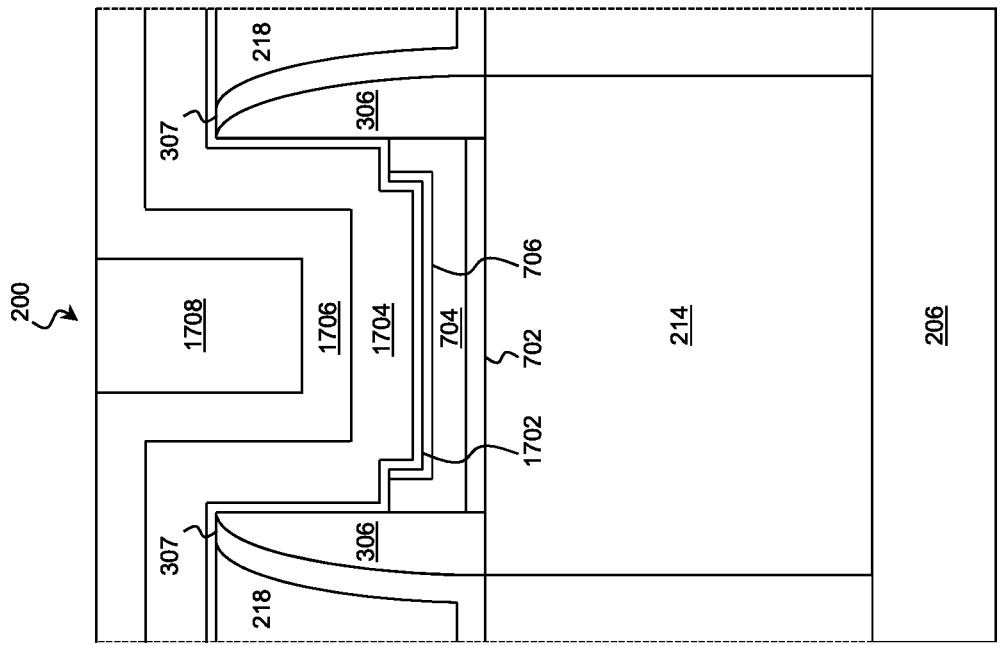

Referring to block 122 of FIG. 1B and to FIGS. 17 and 18, one or more work function layers 1704 are formed within the gate recess 502 on the barrier layer 1702. At the sides of the recess 502, the work function layers 1704 may be disposed on the top of the gate dielectric layer 704 and capping layer 706 and may physically contact and extend along the vertical surfaces of the barrier layer 1702. Suitable work function layer 1704 materials include n-type and/or p-type work function materials based on the type of device to which the gate stack 216 corresponds. Exemplary p-type work function metals include TiN, TaN, Ru, Mo, Al, WN, $ZrSi_2$, $MoSi_2$, $TaSi_2$, $NiSi_2$, WN, other suitable p-type work function materials, and/or combinations thereof. Exemplary n-type work function metals include Ti, Ag, TaAl, TaAlC, TiAlN, TaC, TaCN, TaSiN, Mn, Zr, other suitable n-type work function materials, and/or combinations thereof. The work function layer(s) 1704 may be deposited by any suitable technique including ALD, CVD, PE CVD, PEALD, PVD, and/or combinations thereof. Because vertical portions of the gate dielectric layer 704 and capping layer 706 have been removed, the work function layers 1704 may be wider than the capping layer 706 and wider than the central portion of the gate dielectric layer 704 with the substantially consistent thickness.

Referring to block 124 of FIG. 1B and to FIGS. 17 and 18, a glue layer 1706 may be formed within the recess 502 on the work function layer(s) 1704. At the sides of the recess 502, the glue layer 1706 may physically contact and extend along the vertical surfaces of the work function layer(s) 1704. The glue layer 1706 may include any suitable material, such as metals (e.g., W, Al, Ta, Ti, Ni, Cu, Co, etc.), metal oxides, metal nitrides, and/or combinations thereof. Accordingly, in an embodiment, the glue layer 1706 includes TiN. The glue layer 1706 may be deposited by any suitable technique including ALD, CVD, PE CVD, PEALD, PVD, and/or combinations thereof.

Referring to block 126 of FIG. 1B and to FIGS. 17 and 18, an electrode fill 1708 is formed within the recess 502 on the glue layer 1706. The electrode fill 1708 may include any suitable material including metals (e.g., W, Al, Ta, Ti, Ni, Cu, Co, etc.), metal oxides, metal nitrides and/or combinations thereof, and in an example, the electrode core includes tungsten (W). The electrode fill 1708 may be deposited by any suitable technique including ALD, CVD, PE CVD, PEALD, PVD, and/or combinations thereof.

Figure 20:
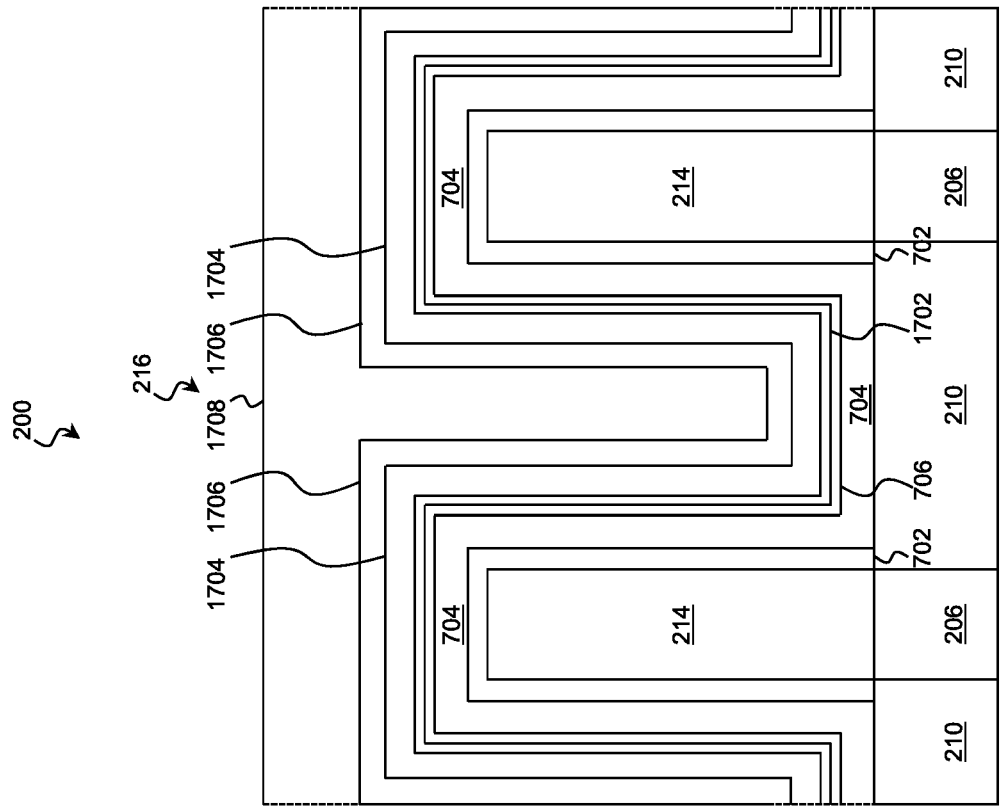
Figure 19:
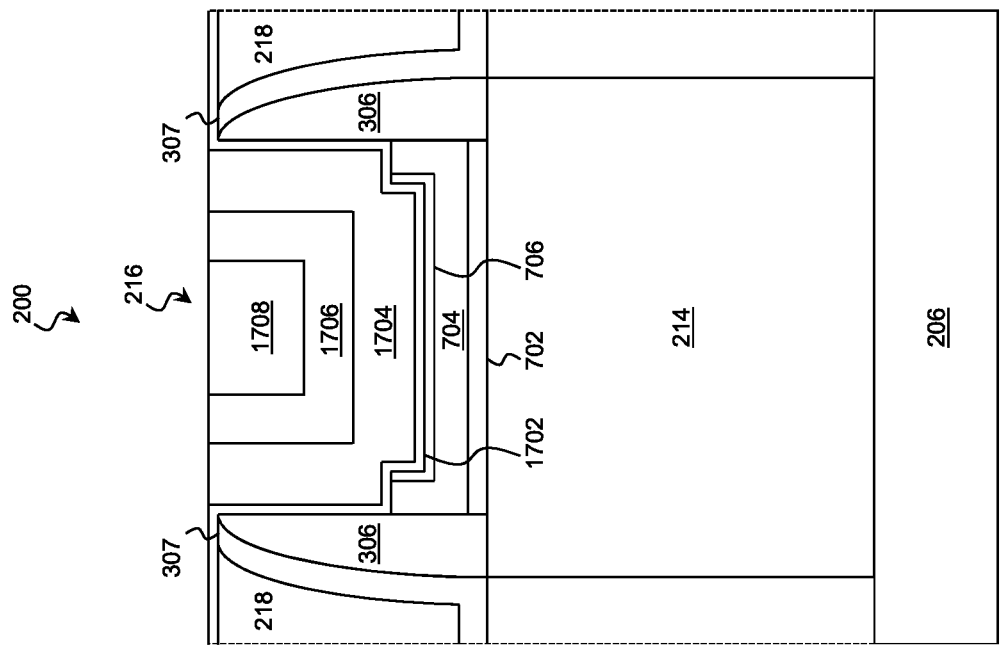

Referring to block 128 of FIG. 1B and to FIGS. 19 and 20, a CMP process may be performed to remove material (e.g., material of: the barrier layer 1702, work function layers 1704, glue layer 1706, electrode fill 1708, etc.) that is outside of the gate stack 216.

Referring to block 130 of FIG. 1B, the workpiece 200 is provided for further fabrication. In various examples, further fabrication includes forming contacts electrically coupled to the gate stack 216 and the source/drain features 212, forming a remainder of an electrical interconnect structure, dicing, packaging, and other fabrication processes.

Figure 22:
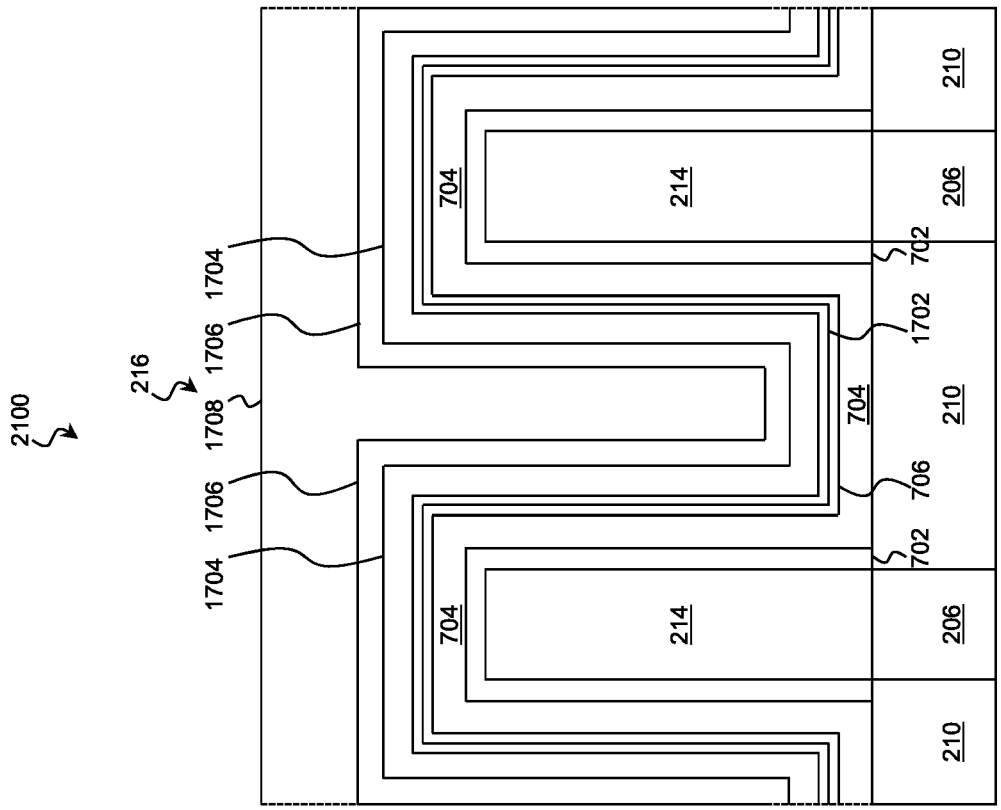
FIG. 22 is a cross-sectional view of a workpiece taken along a second cross-sectional plane where a capping layer is recessed more than a gate dielectric layer according to various aspects of the present disclosure.
Figure 21:
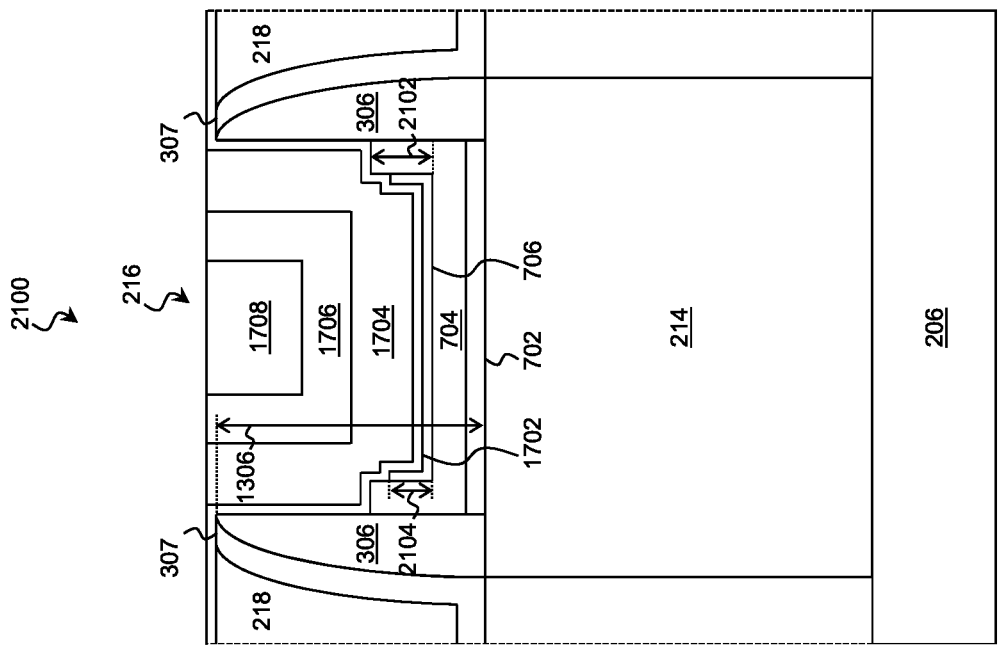
FIG. 21 is a cross-sectional view of a workpiece taken along a first cross-sectional plane where a capping layer is recessed more than a gate dielectric layer according to various aspects of the present disclosure.

As discussed above, the etching of the gate dielectric layer 704 and the capping layer 706 in block 116 may result in the capping layer 706 and the gate dielectric layer 704 having different heights. FIG. 21 is a cross-sectional view of a workpiece 2100 taken along a first cross-sectional plane where a capping layer is recessed more than a gate dielectric layer according to various aspects of the present disclosure. FIG. 22 is a cross-sectional view of the workpiece taken along a second cross-sectional plane where the capping layer is recessed more than the gate dielectric layer according to various aspects of the present disclosure. The workpiece 2100 may be formed using the method 100 of FIGS. 1A and 1B and/or any other suitable technique. FIGS. 21 and 22 have been simplified for the sake of clarity and to better illustrate the concepts of the present disclosure. Additional features may be incorporated into the workpiece 2100, and some of the features described below may be replaced or eliminated for other embodiments of the workpiece 2100.

The workpiece 2100 of FIGS. 21 and 22 is substantially similar to workpiece 200 of FIGS. 2-20 in many respects, and includes a channel region 214, gate spacers 306, an ILD layer 218, and an interfacial layer 702, each substantially as described above. In the illustrated examples, after the etching of block 116, a remaining portion of the gate dielectric layer 704 adjacent a gate spacer 306 has a first height 2102 as measured from the top surface of the portion of the gate dielectric layer 704 away from the gate spacer 306. A remaining portion of the capping layer 706 has a second height 2104 as measured from the top surface of the portion of the gate dielectric layer 704 away from the gate spacer 306. By using different etching techniques (e.g., different etching processes, different etching parameters, and/or different etchants) for the gate dielectric layer 704 and capping layer 706 or by using an etching technique with parameters and/or an etchant that produces a different etchant rate for the materials of the gate dielectric layer 704 and capping layer 706, a gate stack 216 is produced where the first height 2102 is greater than the second height 2104. In various examples, a ratio of the first height 2102 to the second height 2104 is greater than about 1:1 and less than about 2:1. In some such examples, the first height 2102 of the gate dielectric layer 704 is between about 1 nm and about 25 nm, and may be between about 1 and about 10 times the thickness of the gate dielectric layer 704. In some such examples, the ratio of the first height 2102 of the gate dielectric layer 704 to the total gate height 1306 is about 1:4 or less. Accordingly, the majority of the vertical surfaces of the gate spacers 306 may be free of the gate dielectric layer 704.

The barrier layer 1702, work function layer(s) 1704, glue layer 1706, and electrode fill 1708 are disposed one upon the other substantially as described above.

Figure 24:
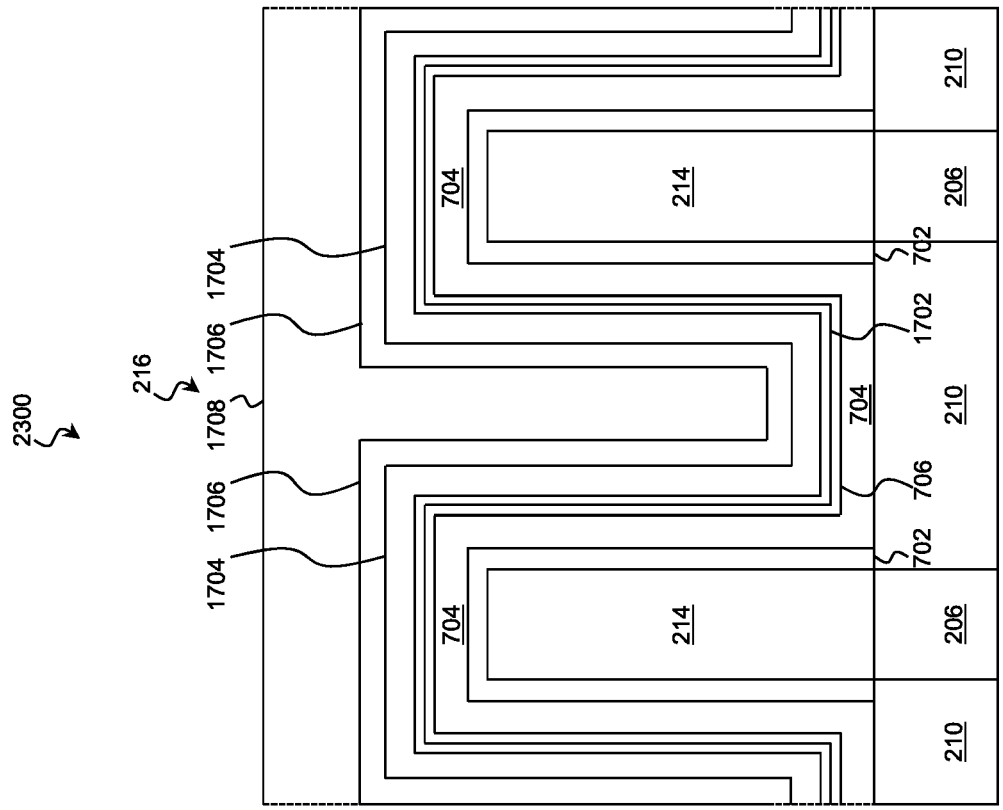
FIG. 24 is a cross-sectional view of a workpiece taken along a second cross-sectional plane where a gate dielectric layer is recessed more than a capping layer according to various aspects of the present disclosure.
Figure 23:
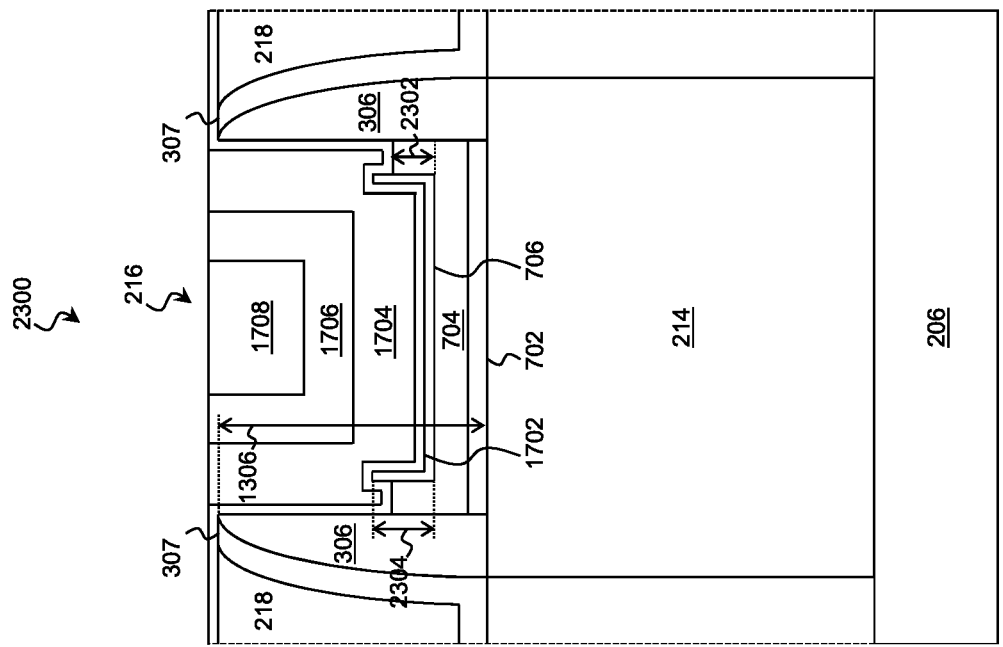
FIG. 23 is a cross-sectional view of a workpiece taken along a first cross-sectional plane where a gate dielectric layer is recessed more than a capping layer according to various aspects of the present disclosure.

In further examples, the height of the remaining the gate dielectric layer 704 is less than that of the capping layer 706 after block 116. FIG. 23 is a cross-sectional view of a workpiece 2300 taken along a first cross-sectional plane where a gate dielectric layer is recessed more than a capping layer according to various aspects of the present disclosure. FIG. 24 is a cross-sectional view of the workpiece 2300 taken along a second cross-sectional plane where the gate dielectric layer is recessed more than the capping layer according to various aspects of the present disclosure. The workpiece 2300 may be formed using the method 100 of FIGS. 1A and 1B and/or any other suitable technique. FIGS. 23 and 24 have been simplified for the sake of clarity and to better illustrate the concepts of the present disclosure. Additional features may be incorporated into the workpiece 2300, and some of the features described below may be replaced or eliminated for other embodiments of the workpiece 2300.

The workpiece 2300 of FIGS. 23 and 24 is substantially similar to workpiece 200 of FIGS. 2-20 and workpiece 2100 of FIGS. 21 and 22 in many respects and includes a channel region 214, gate spacers 306, an ILD layer 218, an interfacial layer 702, a barrier layer 1702, work function layer(s) 1704, a glue layer 1706, and an electrode fill 1708, each substantially as described above.

In the illustrated examples, after the etching of block 116, a remaining portion of the gate dielectric layer 704 adjacent a gate spacer 306 has a first height 2302 as measured from the top surface of the portion of the gate dielectric layer 704 away from the gate spacer 306. A remaining portion of the capping layer 706 has a second height 2304 as measured from the top surface of the portion of the gate dielectric layer 704 away from the gate spacer 306. By using different etching techniques (e.g., different etching processes, different etching parameters, and/or different etchants) for the gate dielectric layer 704 and capping layer 706 or by using an etching technique with parameters and/or an etchant that produces a different etchant rate for the materials of the gate dielectric layer 704 and capping layer 706, a gate stack 216 is produced where the first height 2302 is less than the second height 2304. In various examples, a ratio of the first height 2302 to the second height 2304 is less than 1:1 and greater than about 1:10. In some such examples, the first height 2302 of the gate dielectric layer 704 is between about 1 nm and about 25 nm, and may be between about 1 and about 10 times the thickness of the gate dielectric layer 704. In some such examples, the ratio of the first height 2302 of the gate dielectric layer 704 to the total gate height 1306 is about 1:4 or less. Accordingly, the majority of the vertical surfaces of the gate spacers 306 may be free of the gate dielectric layer 704.

Figure 26:
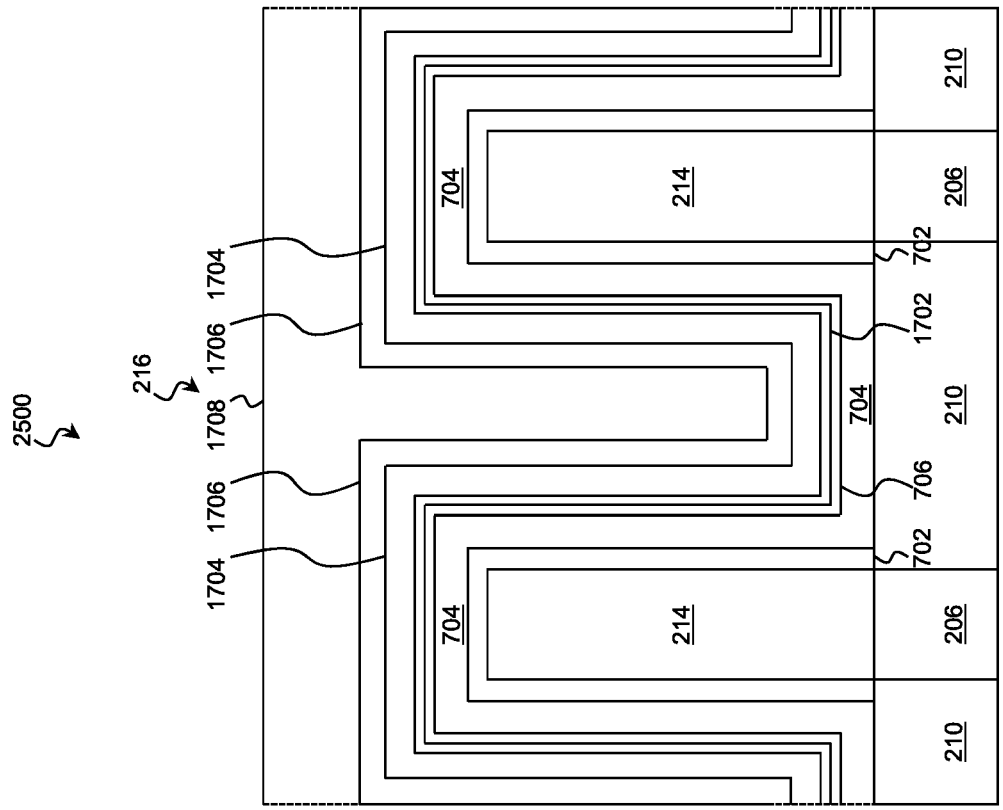
FIG. 26 is a cross-sectional view of a workpiece with an alternative gate stack configuration taken along a second cross-sectional plane according to various aspects of the present disclosure.
Figure 25:
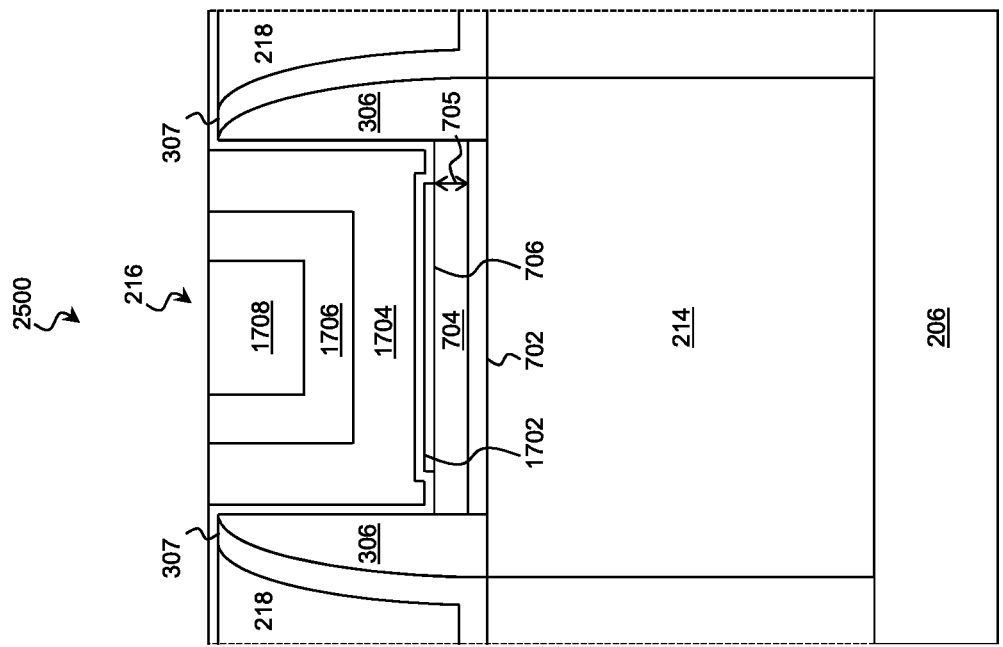
FIG. 25 is a cross-sectional view of a workpiece with an alternative gate stack configuration taken along a first cross-sectional plane according to various aspects of the present disclosure.

As discussed above, the etching of the gate dielectric layer 704 and the capping layer 706 in block 116 may proceed until the height 1304 of the region 1302 is zero or nearly zero. FIG. 25 is a cross-sectional view of a workpiece 2500 with an alternative gate stack configuration taken along a first cross-sectional plane according to various aspects of the present disclosure. FIG. 26 is a cross-sectional view of the workpiece 2500 with an alternative gate stack configuration taken along a second cross-sectional plane according to various aspects of the present disclosure. The workpiece 2500 may be formed using the method 100 of FIGS. 1A and 1B and/or any other suitable technique. FIGS. 25 and 26 have been simplified for the sake of clarity and to better illustrate the concepts of the present disclosure. Additional features may be incorporated into the workpiece 2500, and some of the features described below may be replaced or eliminated for other embodiments of the workpiece 2500.

The workpiece 2500 of FIGS. 25 and 26 is substantially similar to workpiece 200 of FIGS. 2-20 in many respects, and includes a channel region 214, gate spacers 306, an ILD layer 218, an interfacial layer 702, a barrier layer 1702, work function layer(s) 1704, a glue layer 1706, and an electrode fill 1708, each substantially as described above.

In the illustrated examples, after the etching of block 116, the top surface of the gate dielectric layer 704 is substantially planar from one gate spacer 306 to the opposing gate spacer 306, and the gate dielectric layer 704 has substantially consistent thickness throughout. In some examples, the gate dielectric layer 704 has a thickness 705 of between about 0.1 nm and about 3 nm. The top surface of the capping layer 706 may also be substantially planar from one edge of the capping layer 706 to the other, and the capping layer 706 may have substantially consistent thickness throughout. In some examples, because the capping layer 706 is formed inside the gate dielectric layer 704 while the gate dielectric layer 704 has a U-shape, the capping layer 706 does not extend all the way to the gate spacers 306. The barrier layer 1702 is disposed on the capping layer 706 and the gate dielectric layer 704 and physically contacts the gate dielectric layer 704 near the gate spacers 306.

Thus, the present disclosure provides examples of an integrated circuit with a gate stack and a method for forming the integrated circuit. In some examples, a method includes receiving a workpiece that includes: a substrate; a fin extending from the substrate and having a channel region; and a gate stack disposed over the channel region that includes: a pair of opposing gate spacers; a placeholder gate electrode disposed between the pair of opposing gate spacers; and a gate cap disposed on the placeholder gate electrode and extending between the pair of opposing gate spacers. The placeholder gate electrode and the gate cap are removed to form a gate recess between the pair of opposing gate spacers. An interfacial layer is formed on the channel region within the gate recess between the pair of opposing gate spacers. A gate dielectric is formed on the interfacial layer within the gate recess between the pair of opposing gate spacers such that the gate dielectric extends along an entirety of a vertical sidewall of each of the pair of opposing gate spacers. A capping layer is formed on the gate dielectric within the gate recess between the pair of opposing gate spacers such that the capping layer extends along an entirety of a vertical sidewall of the gate dielectric. A barrier feature is formed on the gate dielectric and the capping layer within the gate recess. The barrier feature is removed such that a top surface of the barrier feature is coplanar with or below a top of the pair of opposing gate spacers. A portion of each of the gate dielectric and the capping layer is removed from the vertical sidewall of each of the pair of opposing gate spacers. A remainder of the barrier feature is removed. A barrier layer is formed on the gate dielectric and the capping layer within the gate recess. A glue layer is formed on the barrier layer within the gate recess. An electrode fill is formed on the glue layer within the gate recess. A chemical mechanical planarization process is performed on the workpiece to remove a portion of each of the barrier layer, the glue layer, and the electrode fill that extends beyond the gate recess, and the workpiece is provided for further fabrication.

In further examples, a device includes: a substrate; a fin extending from the substrate that includes: a channel region; and a pair of source/drain features disposed on opposite sides of the channel region; and a gate stack disposed over the channel region that includes: a pair of opposing gate spacers; an interfacial layer disposed directly on the channel region and extending between the pair of opposing gate spacers; a gate dielectric disposed directly on the interfacial layer and on a vertical side surface of each of the pair of opposing gate spacers such that a first portion of each vertical side surface physically contacts the gate dielectric and a second portion of each vertical side surface is free of the gate dielectric and the interfacial layer; a capping layer disposed directly on the gate dielectric; a barrier layer disposed directly on: the capping layer, the gate dielectric, the second portion of each vertical side surface; a work function layer disposed directly on the barrier layer; a glue layer disposed directly on the work function layer; and an electrode fill disposed directly on the glue layer.

In yet further examples, a device includes: a substrate; a fin extending from the substrate that includes: a channel region; and a pair of source/drain features disposed on opposite sides of the channel region; and a gate stack disposed over the channel region that includes: a pair of opposing gate spacers; an interfacial layer disposed directly on the channel region and extending between the pair of opposing gate spacers; a gate dielectric disposed directly on the interfacial layer and on a vertical side surface of each of the pair of opposing gate spacers such that: a first portion of each vertical side surface physically contacts the gate dielectric; a second portion of each vertical side surface is free of the gate dielectric and the interfacial layer; and the gate dielectric has a substantially consistent thickness throughout; a capping layer disposed directly on the gate dielectric; a barrier layer disposed directly on: the capping layer, the gate dielectric, the second portion of each vertical side surface; a work function layer disposed directly on the barrier layer; a glue layer disposed directly on the work function layer; and an electrode fill disposed directly on the glue layer.

In further examples, a method includes receiving a workpiece that includes: a substrate; a fin extending from the substrate and having a channel region; a pair of sidewall spacers disposed over the channel region; a high-k gate dielectric disposed on the channel region between the pair of sidewall spacers and extending along a vertical surface of a first spacer of the pair of sidewall spacers; and a capping layer disposed on the high-k gate dielectric between the pair of sidewall spacers and extending along the vertical surface. A shaping feature is formed on the capping layer and the high-k gate dielectric between the pair of sidewall spacers. A first portion of the high-k gate dielectric and a first portion of the capping layer disposed between the shaping feature and the first spacer are removed to leave a second portion of the high-k gate dielectric and a second portion of the capping layer extending along the vertical surface. The shaping feature is removed, and a remainder of a gate on the high-k gate dielectric and the capping layer is formed. In some such examples, the removing of the first portion of the high-k gate dielectric is such that a majority of the vertical surface is free of the high-k gate dielectric. In some such examples, the second portion of the high-k gate dielectric extends a first distance above a top surface of a third portion of the high-k gate dielectric disposed away from the pair of sidewall spacer, and the first distance is less than one fourth of a height of the vertical surface of the first spacer. In some such examples, the second portion of the high-k gate dielectric extends a first distance above a top surface of a third portion of the high-k gate dielectric disposed away from the pair of sidewall spacers, and the first distance is between about equal to and about 10 times a thickness of the third portion of the high-k gate dielectric. In some such examples, the forming of the remainder of the gate includes forming a barrier layer on the high-k gate dielectric and the capping layer such that the barrier layer directly physically contacts a top surface of the second portion of the high-k gate dielectric and a top surface of the second portion of the capping layer. In some such examples, a first top surface of the barrier layer on the second portion of the high-k gate dielectric is above a second top surface of the barrier layer on a third portion of the high-k gate dielectric disposed away from the pair of sidewall spacers. In some such examples, the forming of the remainder of the gate further includes forming a work function layer on the barrier layer such that the work function layer is on the top surface of the second portion of the high-k gate dielectric and on the top surface of the second portion of the capping layer. In some such examples, the work function layer is wider than the capping layer.

In further examples, the method includes receiving a workpiece that includes: a channel region; a pair of opposing gate spacers disposed over the channel region with a gate recess defined therebetween; a gate dielectric on the channel region within the gate recess such that the gate dielectric extends along a vertical sidewall of the pair of opposing gate spacers. A feature is formed on the gate dielectric within the gate recess. The feature is used to selectively remove a portion of the gate dielectric from the vertical sidewall of the pair of opposing gate spacers. The feature is removed, and a remainder of a gate on the gate dielectric on the gate dielectric. In some such examples, the workpiece further includes a capping layer on the gate dielectric within the gate recess such that the capping layer extends along the vertical sidewall of the pair of opposing gate spacers, and the using of the feature to selectively remove the portion of the gate dielectric includes removing a portion of the capping layer from the vertical sidewall. In some such examples, the forming of the remainder of the gate includes forming a barrier layer on the gate dielectric such that the barrier layer directly physically contacts a top surface of the gate dielectric adjacent one of the pair of opposing gate spacers. In some such examples, the barrier layer directly physically contacts a portion of the vertical sidewall from which the gate dielectric is removed. In some such examples, the forming of the remainder of the gate includes forming a work function layer on the top surface of the gate dielectric adjacent one of the pair of opposing gate spacers. In some such examples, the work function layer is wider than a capping layer disposed on the gate dielectric. In some such examples, a majority of the vertical sidewall of the pair of opposing gate spacers is free of the gate dielectric. In some such examples, a portion of the gate dielectric adjacent the vertical sidewall of the pair of opposing gate spacers extends a first height above another portion the gate dielectric disposed away from the pair of opposing gate spacers, and the first height is less than one fourth of a height of the vertical sidewall. In some such examples, a portion of the gate dielectric adjacent the vertical sidewall of the pair of opposing gate spacers extends a first height above another portion the gate dielectric disposed away from the pair of opposing gate spacers, and the first height is between about equal to and about 10 times a thickness of the another portion of the gate dielectric disposed away from the pair of opposing gate spacers.

In yet further examples, a method includes receiving a workpiece that includes a channel region and a pair of gate spacers disposed over the channel region. A gate dielectric is formed between the pair of gate spacers and extending along a side surface of a first spacer of the pair of gate spacers. A capping layer is formed on the gate dielectric between the pair of gate spacers and extending along the side surface of the first spacer. A portion of the gate dielectric and a portion of the capping layer is removed from between the feature and the side surface of the first spacer such that a remainder of the gate dielectric extends a different height over a top surface of a portion of the gate dielectric away from the pair of gate spacers than a remainder of the capping layer. In some such examples, the remainder of the gate dielectric extends to a first height over the top surface of the portion of the gate dielectric away from the pair of gate spacers, the remainder of the capping layer extends to a second height over the top surface of the portion of the gate dielectric away from the pair of gate spacers, and the removing is such that the first height is greater than the second height. In some such examples, the removing uses an etchant configured to etch a material of the gate dielectric at a different rate than a material of the capping layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a first sidewall spacer and an opposing second sidewall spacer disposed over a substrate;
a gate dielectric layer including a horizontal portion disposed over the substrate at a first height between the first sidewall spacer and the second sidewall spacer and a first vertical portion extending vertically along the first sidewall spacer to a second height that is greater than the first height;
a capping layer disposed over the gate dielectric layer and including a second vertical portion extending vertically along the first vertical portion of the gate dielectric layer to a third height, the third height being less than a height of the first sidewall spacer;
a barrier layer disposed over and physically contacting a top surface of the second vertical portion of the capping layer and a top surface of the first vertical portion of the gate dielectric layer; and
a fill layer disposed over the barrier layer, and
wherein a ratio of the first height of the first vertical portion of the gate dielectric layer to the height of the first sidewall spacer is about 1:4 or less.

2. The device of claim 1, wherein a ratio of the first height of the first vertical portion of the gate dielectric layer to a thickness of the horizontal portion of the gate dielectric layer is between about 1:1 and about 10:1,
wherein a ratio of the first height of the first vertical portion of the gate dielectric layer to a length measured from the first sidewall spacer to the second sidewall spacer is about 1:4 or less.

3. The device of claim 1, wherein the third height is the same as the second height such the top surface of the second vertical portion of the capping layer is level with the top surface of the first vertical portion of the gate dielectric layer.

4. The device of claim 1, wherein the third height is less than the second height.

5. The device of claim 1, wherein the third height is greater than the second height.

6. The device of claim 1, wherein the first vertical portion of the gate dielectric layer has a first sidewall surface physically contacting the first sidewall spacer and a second sidewall surface facing the second sidewall spacer, and
wherein the second vertical portion of the capping layer and the barrier layer both physically contact the second sidewall surface of the first vertical portion of the gate dielectric layer.

7. The device of claim 1, wherein the second vertical portion of the capping layer has a sidewall surface facing the first sidewall spacer, and
wherein the first vertical portion of the gate dielectric layer and the barrier layer both physically contact the sidewall surface of the second vertical portion of the capping layer.

8. A device comprising:
a first sidewall spacer and an opposing second sidewall spacer disposed over a substrate;
a gate dielectric layer disposed over the substrate and extending from the first sidewall spacer to the second sidewall spacer, the gate dielectric layer having a top surface facing away from the substrate;
a capping layer disposed over and physically contacting the top surface of the gate dielectric layer, the capping layer having a first sidewall surface extending to the gate dielectric layer and facing the first sidewall spacer and an opposing second sidewall surface extending to the gate dielectric layer and facing the second sidewall spacer; and
a barrier layer disposed over and physically contacting the top surface of the gate dielectric layer, the first sidewall surface of the capping layer and the second sidewall surface of the capping layer, the barrier layer additionally extending from the first sidewall spacer to the second sidewall spacer.

9. The device of claim 8, wherein a height of the first sidewall spacer is between about 10 nm and about 200 nm, and
wherein a length measured from the first sidewall spacer to the second sidewall spacer is between about 10 nm and about 100 nm.

10. The device of claim 8, further comprising a fin structure disposed on the substrate, and
wherein the gate dielectric layer, the capping layer and the gate electrode are disposed over the fin structure.

11. The device of claim 8, further comprising:
a work function metal layer disposed over the barrier layer; and
a fill layer disposed over the work function metal layer, and
wherein a top surface of the barrier layer is substantially coplanar with a top surface of the work function metal layer and a top surface of the fill layer.

12. The device of claim 8, wherein the capping layer further includes a top surface extending from the first sidewall surface to the second sidewall surface, and
wherein the gate electrode physically contacts the top surface of the capping layer.

13. The device of claim 8, wherein the first sidewall spacer extends to a greater height over the substrate than the capping layer.

14. A device comprising:
- a first sidewall spacer and an opposing second sidewall spacer disposed over a substrate;
- a gate dielectric layer disposed over the substrate and extending from the first sidewall spacer to the second sidewall spacer, the gate dielectric layer including a first vertical portion extending vertically along the first sidewall spacer to a first height, the first vertical portion including a sidewall surface facing the second sidewall spacer;
- a capping layer disposed over the gate dielectric layer, the capping layer including a second vertical portion extending vertically along and physically contacting the sidewall surface of the first vertical portion of the gate dielectric layer, the second vertical portion extending to a second height that is different than the first height; and
- a gate electrode disposed over the capping layer and extending to at least one of the first and second sidewall spacers.

15. The device of claim 14, wherein a ratio of the first height of the first vertical portion of the gate dielectric layer to the second height of the second vertical portion of the capping layer is greater than about 1:1 and less than about 2:1.

16. The device of claim 14, wherein a ratio of the first height of the first vertical portion of the gate dielectric layer to the second height of the second vertical portion of the capping layer is less than about 1:1 and greater than about 1:10.

17. The device of claim 14, wherein the gate electrode includes a barrier layer physically contacting both the first and second sidewall spacers.

18. The device of claim 17, wherein the barrier layer is disposed over a top surface of the first sidewall spacer, the top surface facing away from the substrate.

19. The device of claim 14, wherein the first height of the first vertical portion of the gate dielectric layer is between about 1 nm and about 25 nm.

20. The device of claim 14, wherein a ratio of the first height of the first vertical portion of the gate dielectric layer to the height of the first sidewall spacer is about 1:4 or less.

* * * * *